US011488977B2

(12) United States Patent
Wu et al.

(10) Patent No.: US 11,488,977 B2
(45) Date of Patent: Nov. 1, 2022

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Linchun Wu, Wuhan (CN); Kun Zhang, Wuhan (CN); Wenxi Zhou, Wuhan (CN); Zhiliang Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/147,396

(22) Filed: Jan. 12, 2021

(65) Prior Publication Data
US 2021/0320124 A1 Oct. 14, 2021

Related U.S. Application Data

(63) Continuation of application No. PCT/CN2020/129331, filed on Nov. 17, 2020.

(30) Foreign Application Priority Data

Apr. 14, 2020 (CN) ................. PCT/CN2020/084600
Apr. 14, 2020 (CN) ................. PCT/CN2020/084603
(Continued)

(51) Int. Cl.
*H01L 27/11582* (2017.01)
*H01L 21/768* (2006.01)
*H01L 21/285* (2006.01)

(52) U.S. Cl.
CPC .. *H01L 27/11582* (2013.01); *H01L 21/76802* (2013.01); *H01L 21/76877* (2013.01); *H01L 21/28518* (2013.01)

(58) Field of Classification Search
CPC ......... H01L 27/11582; H01L 21/76802; H01L 21/76877; H01L 21/28518
See application file for complete search history.

(56) References Cited

U.S. PATENT DOCUMENTS

2014/0167131 A1  6/2014  Lu et al.
2015/0076584 A1  3/2015  Pachamuthu et al.
(Continued)

FOREIGN PATENT DOCUMENTS

CN  109742081 A  5/2019
CN  109817633 A  5/2019
(Continued)

OTHER PUBLICATIONS

International Search Report issued in corresponding International Application No. PCT/CN2020/129331, dated Feb. 19, 2021, 5 pages.

Primary Examiner — Karen Kusumakar
(74) Attorney, Agent, or Firm — Bayes PLLC

(57) ABSTRACT

Embodiments of 3D memory devices and methods for forming the same are disclosed. In an example, a method for forming a 3D memory device is disclosed. A first polysilicon layer, a dielectric sacrificial layer, a second polysilicon layer, and a dielectric stack are sequentially formed above a substrate. A channel structure extending vertically through the dielectric stack, the second polysilicon layer, and the dielectric sacrificial, and into the first polysilicon layer is formed. An opening extending vertically through the dielectric stack and the second polysilicon layer, and extending vertically into or through the dielectric sacrificial layer to expose part of the dielectric sacrificial layer, and a polysilicon spacer along part of a sidewall of the opening are formed. The dielectric sacrificial layer is replaced, through
(Continued)

the opening, with a third polysilicon layer between the first and second polysilicon layers.

20 Claims, 14 Drawing Sheets

(30) Foreign Application Priority Data

| Apr. 27, 2020 | (CN) | ................. PCT/CN2020/087295 |
| Apr. 27, 2020 | (CN) | ................. PCT/CN2020/087296 |
| May 27, 2020 | (CN) | ................. PCT/CN2020/092512 |
| May 27, 2020 | (CN) | ................. PCT/CN2020/092513 |

(56) References Cited

U.S. PATENT DOCUMENTS

| 2015/0380418 A1 | 12/2015 | Zhang et al. |
| 2018/0226426 A1 | 8/2018 | Purayath |
| 2019/0157294 A1* | 5/2019 | Kanamori ........... H01L 27/1157 |
| 2020/0258895 A1 | 8/2020 | Xiao et al. |
| 2020/0312867 A1 | 10/2020 | Xiao |

FOREIGN PATENT DOCUMENTS

| CN | 111788687 A | 10/2020 |
| CN | 111801802 A | 10/2020 |
| TW | I648843 B | 1/2019 |
| TW | I652805 B | 3/2019 |
| TW | I690097 B | 4/2020 |
| TW | I704679 B | 9/2020 |
| TW | I706547 B | 10/2020 |
| TW | I707459 B | 10/2020 |

* cited by examiner

THREE-DIMENSIONAL MEMORY DEVICES AND METHODS FOR FORMING THE SAME

CROSS-REFERENCE TO RELATED APPLICATIONS

This application is continuation of International Application No. PCT/CN2020/129331, filed on Nov. 17, 2020, entitled "THREE-DIMENSIONAL MEMORY DEVICES AND METHODS FOR FORMING THE SAME," which is hereby incorporated by reference in its entirety. This application also claims the benefit of priorities to International Application No. PCT/CN2020/084600, filed on Apr. 14, 2020, entitled "THREE-DIMENSIONAL MEMORY DEVICE WITH BACKSIDE SOURCE CONTACT," International Application No. PCT/CN2020/084603, filed on Apr. 14, 2020, entitled "METHOD FOR FORMING THREE-DIMENSIONAL MEMORY DEVICE WITH BACKSIDE SOURCE CONTACT," International Application No. PCT/CN2020/087295, filed on Apr. 27, 2020, entitled "THREE-DIMENSIONAL MEMORY DEVICE AND METHOD FOR FORMING THE SAME," International Application No. PCT/CN2020/087296, filed on Apr. 27, 2020, entitled "THREE-DIMENSIONAL MEMORY DEVICE AND METHOD FOR FORMING THE SAME," International Application No. PCT/CN2020/092512, filed on May 27, 2020, entitled "THREE-DIMENSIONAL MEMORY DEVICES," and International Application No. PCT/CN2020/092513, filed on May 27, 2020, entitled "METHODS FOR FORMING THREE-DIMENSIONAL MEMORY DEVICES," all of which are incorporated herein by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a method for forming a 3D memory device is disclosed. A first polysilicon layer, a dielectric sacrificial layer, a second polysilicon layer, and a dielectric stack are sequentially formed above a substrate. A channel structure extending vertically through the dielectric stack, the second polysilicon layer, and the dielectric sacrificial, and into the first polysilicon layer is formed. An opening extending vertically through the dielectric stack and the second polysilicon layer, and extending vertically into or through the dielectric sacrificial layer to expose part of the dielectric sacrificial layer, and a polysilicon spacer along part of a sidewall of the opening are formed. The dielectric sacrificial layer is replaced, through the opening, with a third polysilicon layer between the first and second polysilicon layers.

In another example, a method for forming a 3D memory device is disclosed. A stop layer, a dielectric layer, a first polysilicon layer, a dielectric sacrificial layer, a second polysilicon layer, and a dielectric stack are sequentially formed at a first side of a substrate. A channel structure extending vertically through the dielectric stack, the second polysilicon layer, and the dielectric sacrificial, and into the first polysilicon layer is formed. An opening extending vertically through the dielectric stack and the second polysilicon layer and extending vertically into or through the dielectric sacrificial layer is formed to expose part of the dielectric sacrificial layer. The dielectric sacrificial layer is replaced, through the opening, with a third polysilicon layer between the first and second polysilicon layers. The substrate is removed from a second side opposite to the first side of the substrate, stopping at the stop layer. A source contact opening extending vertically through the stop layer and the dielectric layer is formed to expose part of the first polysilicon layer. A source contact structure in the source contact opening and an interconnect layer connected to the source contact structure are simultaneously formed.

In still another example, a 3D memory device includes a polysilicon layer, a memory stack including interleaved stack conductive layers and stack dielectric layers, a channel structure, and a slit structure. The channel structure extends vertically through the memory stack and into the polysilicon layer and includes a memory film and a semiconductor channel Part of the semiconductor channel along a sidewall of the channel structure is in contact with a sublayer of the polysilicon layer. The slit structure extends vertically through the memory stack and the sublayer of the polysilicon layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
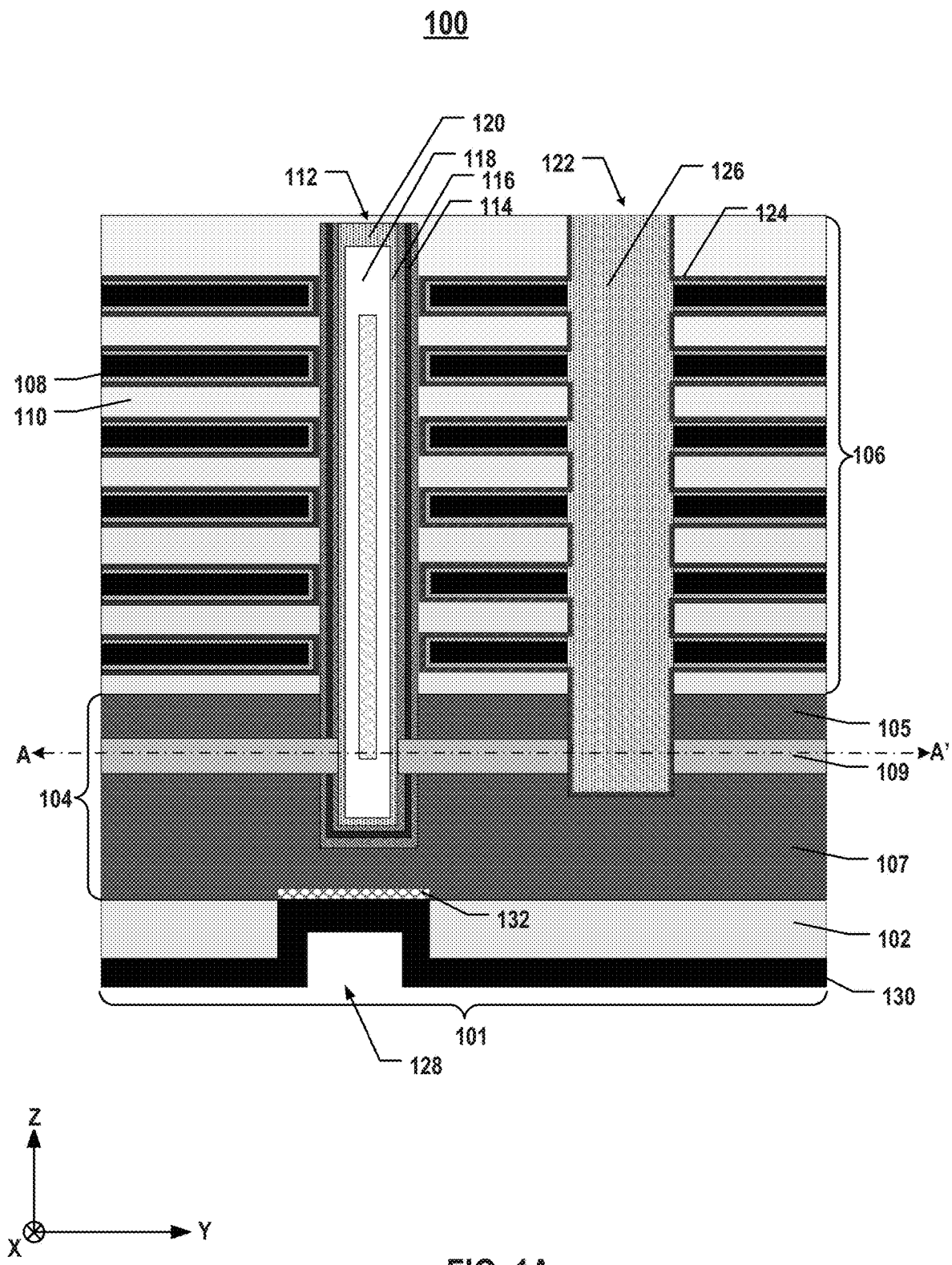
FIG. 1A illustrates a side view of a cross-section in an exemplary device region of a 3D memory device, according to various embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (VIA) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D NAND memory devices, semiconductor plugs are selectively grown to surround the sidewalls of channel structures, e.g., known as sidewall selective epitaxial growth (SEG). Compared with another type of semiconductor plugs that are formed at the lower end of the channel structures, e.g., bottom SEG, the formation of sidewall SEG avoids the etching of the memory film and semiconductor channel at the bottom surface of channel holes (also known as "SONO" punch), thereby increasing the process window, in particular when fabricating 3D NAND memory devices with advanced technologies, such as having 96 or more levels with a multi-deck architecture. Moreover, the sidewall SEG structure can be combined with backside processes to form source contacts from the backside of the substrate to avoid leakage current and parasitic capacitance between front side source contacts and word lines and increase the effective device area.

In forming the sidewall SEG structure, a sacrificial layer needs to be formed first in order to open the memory film and expose the semiconductor channel on the sidewall of the channel structure, which is later replaced by the layer including the sidewall SEG structure, e.g., a polysilicon layer. The sacrificial layer is usually made of polysilicon. However, the use of a polysilicon sacrificial layer requires a complicated spacer structure on the sidewall of the opening (e.g., gate line slit (GLS)) for replacing the polysilicon sacrificial layer as well as the etching of the opening to be stopped within the polysilicon sacrificial layer. These challenges limit the production yield and increase the cost of the 3D NAND memory devices with sidewall SEG structures.

Various embodiments in accordance with the present disclosure provide improved 3D memory devices and fabrication methods thereof. By changing the material of the sacrificial layer for forming the sidewall SEG structure from polysilicon to dielectrics, such as silicon nitride or silicon oxide, the materials and structure of the spacer on the sidewall of the opening (e.g., GLS) can be simplified, thereby reducing the cost. Moreover, the dielectric sacrificial layer allows a larger etch window for the opening (e.g., GLS) compared with the polysilicon sacrificial layer since the etching can now stop within the dielectric sacrificial layer or extend further through the dielectric sacrificial layer. As a result, the process can be simplified, and the production yield can be increased.

Figure 1B:
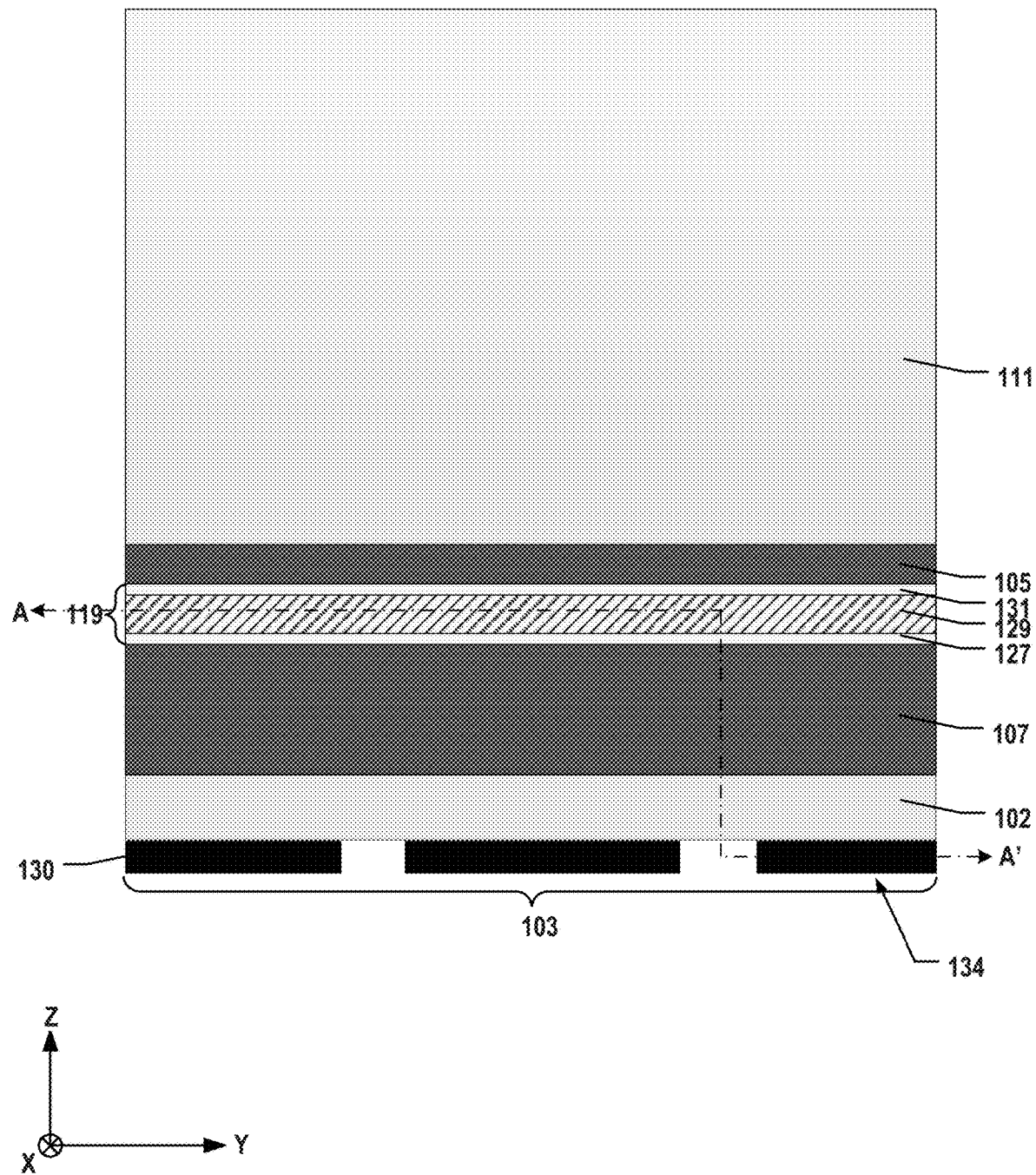
FIG. 1B illustrates a side view of a cross-section in an exemplary peripheral region of a 3D memory device, according to various embodiments of the present disclosure.
Figure 1C:
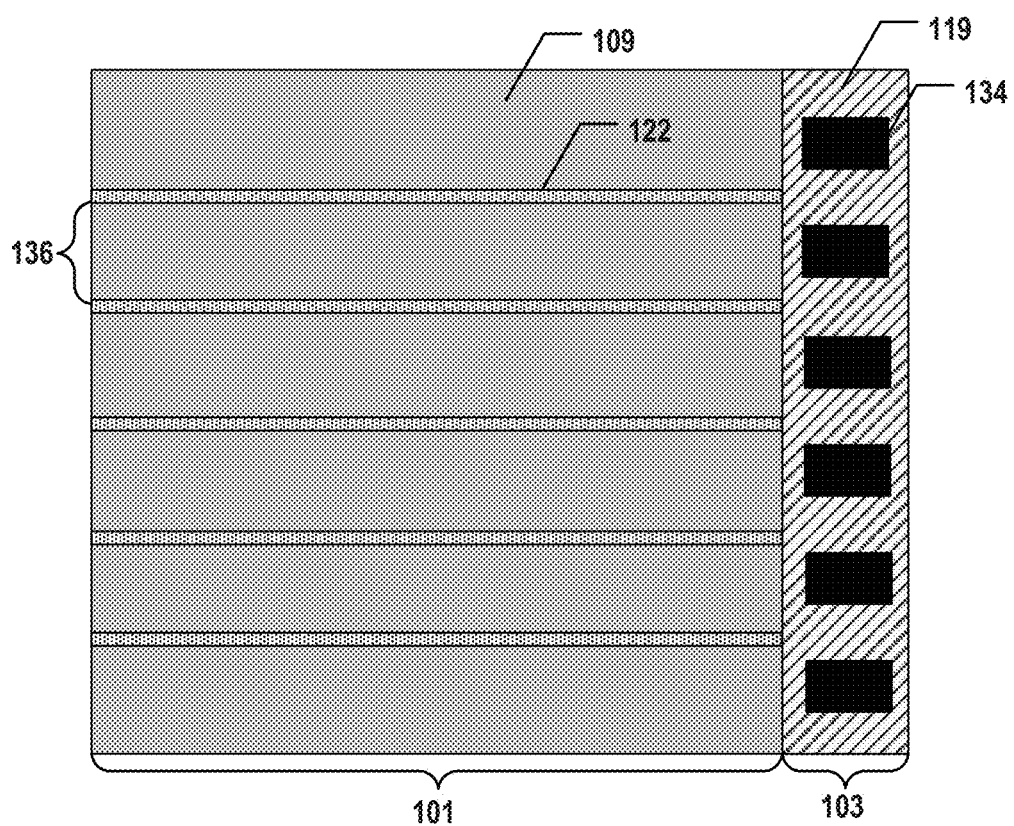
FIG. 1C illustrates a plan view of cross-sections of an exemplary 3D memory device, according to various embodiments of the present disclosure.

FIG. 1A illustrates a side view of a cross-section in an exemplary device region of a 3D memory device 100, according to various embodiments of the present disclosure. FIG. 1B illustrates a side view of a cross-section in an exemplary peripheral region of 3D memory device 100, according to various embodiments of the present disclosure. FIG. 1C illustrates a plan view of cross-sections of an exemplary 3D memory device, according to various embodiments of the present disclosure. In some embodiments, a 3D memory device 100 in FIGS. 1A and 1B includes a substrate (not shown), which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, the substrate is a thinned substrate (e.g., a semiconductor layer), which was thinned by grinding, etching, chemical mechanical polishing (CMP), or any combination thereof.

It is noted that x-, y-, and z-axes are included in FIGS. 1A-1C to illustrate the spatial relationships of the components in 3D memory device 100. The substrate includes two lateral surfaces extending laterally in the x-y plane: a front surface on the front side of the wafer, and a back surface on the backside opposite to the front side of the wafer. The x- and y-directions are two orthogonal directions in the wafer plane: x-direction is the word line direction, and the y-direction is the bit line direction. The z-axis is perpendicular to both the x- and y-axes. As used herein, whether one component (e.g., a layer or a device) is "on," "above," or "below" another component (e.g., a layer or a device) of a semiconductor device (e.g., 3D memory device 100) is determined relative to the substrate of the semiconductor device in the z-direction (the vertical direction perpendicular to the x-y plane) when the substrate is positioned in the lowest plane of the semiconductor device in the z-direction. The same notion for describing spatial relationships is applied throughout the present disclosure.

In some embodiments, 3D memory device 100 is part of a non-monolithic 3D memory device, in which the components are formed separately on different substrates and then bonded in a face-to-face manner, a face-to-back manner, or a back-to-back manner Peripheral devices (not shown), such as any suitable digital, analog, and/or mixed-signal peripheral circuits used for facilitating the operation of 3D memory device 100, can be formed on a separate peripheral device substrate different from the memory array substrate on which the components shown in FIGS. 1A and 1B are formed. It is understood that the memory array substrate may be removed from 3D memory device 100 as described below in detail, and the peripheral device substrate may become the substrate of 3D memory device 100. It is further understood that depending on the way how the peripheral device substrate and the memory array device substrate are bonded, the memory array devices (e.g., shown in FIGS. 1A and 1B) may be in the original positions or may be flipped upside down in 3D memory device 100. For ease of reference, FIGS. 1A and 1B depict a state of 3D memory device 100 in which the memory array devices are in the original positions (i.e., not flipped upside down). However, it is understood that in some examples, the memory array devices shown in FIGS. 1A and 1B may be flipped upside down in 3D memory device 100, and their relative positions may be changed accordingly. The same notion for describing the spatial relationships is applied throughout the present disclosure.

As shown in FIG. 1C, in the plan view, 3D memory device 100 can include a device region 101 in which the memory stack (and staircase structures thereof) and channel structures are formed. Device region 101 is divided into multiple areas 136 in the y-direction (e.g., the bit line direction), such as blocks, by parallel slit structures 122 each extending laterally in the x-direction (e.g., the word line direction). 3D memory device 100 can also include one or more peripheral regions 103 outside of device region 101 in which memory stack 106 (e.g., in FIG. 1A) is formed. Peripheral region 103 is at the edge of 3D memory device 100, according to some embodiments. In some embodiments, contact pads 134 for pad-out are formed in peripheral region 103.

As shown in FIG. 1A, 3D memory device 100 can include a dielectric layer 102 in device region 101. Dielectric layer 102 can include one or more interlayer dielectric (ILD) layers (also known as "intermetal dielectric (IMD) layers") in which the interconnect lines and vertical interconnect access (VIA) contacts can form. The ILD layers of dielectric layer 102 can include dielectric materials including, but not limited to, silicon oxide, silicon nitride, silicon oxynitride, low dielectric constant (low-k) dielectrics, or any combination thereof. In some embodiments, dielectric layer 102 includes silicon oxide. As shown in FIG. 1B, dielectric layer 102 can extend laterally into peripheral region 103. In other words, dielectric layer 102 can be a continuous layer, such as a continuous silicon oxide layer, in device region 101 and peripheral region 103 of 3D memory device 100.

As shown in FIG. 1A, 3D memory device 100 can also include a polysilicon layer 104 above dielectric layer 102 in device region 101. Polysilicon layer 104 includes an N-type doped polysilicon layer, according to some embodiments. That is, polysilicon layer 104 can be doped with any suitable N-type dopants, such as phosphorus (P), arsenic (Ar), or antimony (Sb), which contribute free electrons and increase the conductivity of the intrinsic semiconductor. As described below in detail, due to a diffusion process, polysilicon layer 104 can have a uniform doping concentration profile in the vertical direction. In some embodiments, the doping concentration of polysilicon layer 104 is between about $10^{19}$ $cm^{-3}$ and about $10^{22}$ $cm^{-3}$, such as between $10^{19}$ $cm^{-3}$ and $10^{22}$ $cm^{-3}$ (e.g., $10^{19}$ $cm^{-3}$, $2\times10^{19}$ $cm^{-3}$, $3\times10^{19}$ $cm^{-3}$, $4\times10^{19}$ $cm^{-3}$, $5\times10^{19}$ $cm^{-3}$, $6\times10^{19}$ $cm^{-3}$, $7\times10^{19}$ $cm^{-3}$, $8\times10^{19}$ $cm^{-3}$, $9\times10^{19}$ $cm^{-3}$, $10^{20}$ $cm^{-3}$, $2\times10^{20}$ $cm^{-3}$, $3\times10^{20}$ $cm^{-3}$, $4\times10^{20}$ $cm^{-3}$, $5\times10^{20}$ $cm^{-3}$, $6\times10^{20}$ $cm^{-3}$, $7\times10^{20}$ $cm^{-3}$, $8\times10^{20}$ $cm^{-3}$, $9\times10^{20}$ $cm^{-3}$, $10^{21}$ $cm^{-3}$, $2\times10^{21}$ $cm^{-3}$, $3\times10^{21}$ $cm^{-3}$, $4\times10^{21}$ $cm^{-3}$, $5\times10^{21}$ $cm^{-3}$, $6\times10^{21}$ $cm^{-3}$, $7\times10^{21}$ $cm^{-3}$, $8\times10^{21}$ $cm^{-3}$, $9\times10^{21}$ $cm^{-3}$, $10^{22}$ $cm^{-3}$, any range bounded by the lower end by any of these values, or in any range defined by any two of these values). Although FIG. 1A shows that polysilicon layer 104 is above dielectric layer 102, as described above, it is understood that dielectric layer 102 may be above polysilicon layer 104 in some examples because the memory array devices shown in FIG. 1A may be flipped upside down, and their relative positions may be changed accordingly in 3D memory device 100. In some embodiments, the memory array devices shown in FIG. 1A are flipped upside down (in the top) and bonded to peripheral devices (in the bottom) in 3D memory device 100, such that dielectric layer 102 is above polysilicon layer 104.

As shown in FIG. 1A, 3D memory device 100 can also include an interconnect layer 130 below dielectric layer 102. Interconnect layer 130 is at the opposite side of polysilicon layer 104 with respect to dielectric layer 102 (i.e., the backside) and thus, referred to as a "backside interconnect layer", according to some embodiments. Interconnect layer 130 can include a plurality of interconnects (also referred to herein as "contacts"), including lateral interconnect lines and VIA contacts. As used herein, the term "interconnects" can broadly include any suitable types of interconnects, such as back-end-of-line (BEOL) interconnects. The interconnect lines and VIA contacts in the interconnect layer can include conductive materials including, but not limited to, tungsten (W), cobalt (Co), copper (Cu), aluminum (Al), silicides, or any combination thereof. As shown in FIG. 1B, interconnect layer 130 can extend laterally into peripheral region 103. In other words, interconnect layer 130 can be a continuous layer, such as a continuous Al layer, in device region 101 and peripheral region 103 of 3D memory device 100. In some embodiments, interconnect layer 130 includes one or more contact pads 134 for pad-out in peripheral region 103, as shown in FIGS. 1B and 1C.

In some embodiments, 3D memory device 100 further includes a source contact structure 128 extending vertically through dielectric layer 102 from the opposite side of polysilicon layer 104 with respect to dielectric layer 102 (i.e., the backside) to be in contact with polysilicon layer 104. It is understood that the depth that source contact structure 128 extends into polysilicon layer 104 may vary in different examples. Source contact structure can electrically connect the source of the NAND memory strings of 3D memory device 100 to the peripheral devices through polysilicon layer 104 from the backside of the memory array substrate (removed) and thus, can be referred to herein as a "backside source pick up" as well. Source contact structure 128 can include any suitable types of contacts. In some embodiments, source contact structure 128 includes a VIA contact. In some embodiments, source contact structure 128 includes a wall-shaped contact extending laterally.

In some embodiments, source contact structure 128 includes a silicide layer 132 in contact with polysilicon layer 107, which can reduce the contact resistance between polysilicon and a metal. Silicide layer 132 can include any suitable metal silicides, such as nickel silicide (NiSi). As shown in FIG. 1A, source contact structure 128 can also include part of interconnect layer 130, such as an Al layer, below and in contact with silicide layer 132. In other words, interconnect layer 130 is connected to source contact structure 128, according to some embodiments. As described below in detail with respect to the fabrication process, source contact structure 128 can include a source contact opening in which silicide layer 132 and interconnect layer 130 are deposited. As a result, source contact structure 128 and interconnect layer 130 can include the same metal material, such as Al.

In some embodiments, 3D memory device 100 is a NAND Flash memory device in which memory cells are provided in the form of an array of NAND memory strings. Each NAND memory string can include a channel structure 112 that extends through a plurality of pairs each including a stack conductive layer 108 and a stack dielectric layer 110 (referred to herein as "conductive/dielectric layer pairs"). The stacked conductive/dielectric layer pairs are also referred to herein as a memory stack 106. The number of the conductive/dielectric layer pairs in memory stack 106 (e.g., 32, 64, 96, 128, 160, 192, 224, 256, etc.) determines the number of memory cells in 3D memory device 100. Although not shown in FIG. 1A, it is understood that in some embodiments, memory stack 106 may have a multi-deck architecture, such as a dual-deck architecture that includes a lower memory deck and an upper memory deck on the lower memory deck. The numbers of the pairs of stack conductive layers 108 and stack dielectric layers 110 in each memory deck can be the same or different.

Memory stack 106 can include a plurality of interleaved stack conductive layers 108 and stack dielectric layers 110 above polysilicon layer 104 in device region 101. Stack conductive layers 108 and stack dielectric layers 110 in memory stack 106 can alternate in the vertical direction. In other words, except the ones at the top or bottom of memory stack 106, each stack conductive layer 108 can be adjoined by two stack dielectric layers 110 on both sides, and each stack dielectric layer 110 can be adjoined by two stack conductive layers 108 on both sides. Stack conductive layers 108 can include conductive materials including, but not limited to, W, Co, Cu, Al, polysilicon, doped silicon, silicides, or any combination thereof. Each stack conductive layer 108 can include a gate electrode (gate line) surrounded by an adhesion layer and a gate dielectric layer 124. The gate electrode of stack conductive layer 108 can extend laterally as a word line, ending at one or more staircase structures (not shown) of memory stack 106. Stack dielectric layers 110 can include dielectric materials including, but not limited to, silicon oxide, silicon nitride, silicon oxynitride, or any combination thereof.

As shown in FIG. 1A, each channel structure 112 extending vertically through memory stack 106 and into polysilicon layer 104 in device region 101. That is, channel structure 112 can include two portions: the lower portion surrounded by polysilicon layer 104 (i.e., below the interface between polysilicon layer 104 and memory stack 106) and the upper portion surrounded by memory stack 106 (i.e., above the interface between polysilicon layer 104 and memory stack 106). As used herein, the "upper portion/end" of a component (e.g., channel structure 112) is the portion/end farther away from the substrate in the y-direction, and the "lower portion/end" of the component (e.g., channel structure 112) is the portion/end closer to the substrate in the y-direction when the substrate is positioned in the lowest plane of 3D memory device 100.

Channel structure 112 can include a channel hole filled with semiconductor material(s) (e.g., as a semiconductor channel 116) and dielectric material(s) (e.g., as a memory film 114). In some embodiments, semiconductor channel 116 includes silicon, such as amorphous silicon, polysilicon, or single crystalline silicon. In one example, semiconductor channel 116 includes polysilicon. In some embodiments, memory film 114 is a composite layer including a tunneling layer, a storage layer (also known as a "charge trap layer"), and a blocking layer. The remaining space of the channel hole can be partially or fully filled with a capping layer 118 including dielectric materials, such as silicon oxide, and/or an air gap. Channel structure 112 can have a cylinder shape (e.g., a pillar shape). Capping layer 118, semiconductor channel 116, the tunneling layer, the storage layer, and the blocking layer of memory film 114 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, or any combination thereof. The blocking layer can include silicon oxide, silicon oxynitride, high-k dielectrics, or any combination thereof. In one example, memory film 114 can include a composite layer of silicon oxide/silicon oxynitride/silicon oxide (ONO). In some embodiments, channel structure 112 further includes a channel plug 120 at the top of the upper portion of channel structure 112. Channel plug 120 can include semiconductor materials (e.g., polysilicon). In some embodiments, channel plug 120 functions as the drain of the NAND memory string.

As shown in FIG. 1A, part of semiconductor channel 116 along the sidewall of channel structure 112 (e.g., in the lower portion of channel structure 112) is in contact with a sublayer 109 of polysilicon layer 104, according to some embodiments. That is, memory film 114 is disconnected in the lower portion of channel structure 112 that abuts sublayer 109 of polysilicon layer 104, exposing semiconductor channel 116 to be in contact with the surrounding sublayer 109 of polysilicon layer 104, according to some embodiments. As a result, sublayer 109 of polysilicon layer 104 surrounding and in contact with semiconductor channel 116 can work as the "sidewall SEG" of channel structure 112 to replace the "bottom SEG" as described above, which can mitigate issues such as overlay control, epitaxial layer formation, and SONO punch. As described below in detail, sublayer 109 of polysilicon layer 104 is formed separately from the rest of polysilicon layer 104, according to some embodiments. However, it is understood that as sublayer 109 of polysilicon layer 104 may have the same polysilicon material as the rest of polysilicon layer 104, and the doping concentration may be nominally uniform in polysilicon layer 104 after diffusion, sublayer 109 may not be distinguishable from the rest of polysilicon layer 104 in 3D memory device 100. Nevertheless, sublayer 109 refers to the part of polysilicon layer 104 that is in contact with semiconductor channel 116, instead of memory film 114, in the lower portion of channel structure 112. As shown in FIG. 1A, besides sublayer 109, the rest of polysilicon layer 104 can include an upper sublayer 105 and a lower sublayer 107 above and below sublayer 109, respectively, although the boundaries between sublayers 105, 107, and 109 may be indistinguishable as sublayers 105, 107, and 109 may have the same polysilicon material with nominally uniform doping concentration.

As shown in FIG. 1A, 3D memory device 100 can further include slit structures 122 in device region 101. As also shown in FIG. 1C, each slit structure 122 can extend laterally in the x-direction (e.g., the word line direction) to divide memory stack 106 in device region 101 into multiple areas 136, such as blocks. For example, memory stack 106 may be divided into a plurality of memory blocks by slit structures 122, such that the array of channel structures 112 can be separated into each memory block. In some embodiments, slit structure 122 is an insulating structure that does not include any contact therein (i.e., not functioning as the source contact). As shown in FIG. 1A, each slit structure 122 includes an opening (e.g., a slit) filled with one or more dielectric materials, including, but not limited to, silicon oxide, silicon nitride, silicon oxynitride, or any combination thereof. In one example, each slit structure 122 may be filled with silicon oxide as an insulator core 126 and high-k dielectrics connecting with gate dielectric layer 124.

Slit structures 122 each extending vertically through interleaved stack conductive layers 108 and stack dielectric layers 110 of memory stack 106 and into polysilicon layer 104. Slit structure 122 can extend vertically into sublayer 109 or through sublayer 109. As shown in FIG. 1A, in some embodiments, slit structure 122 can extend through upper sublayer 105 and sublayer 109 into lower sublayer 107, such that slit structure 122 abuts the entire thickness of sublayer 109. It is understood that in some examples, slit structure 122 may extend through upper sublayer 105 and into sublayer 109, such that slit structure 122 abuts part of the entire thickness of sublayer 109. That is, the lower end of slit structure 122 can stop at anywhere of sublayer 109 or lower sublayer 107 (but not in upper sublayer 105) due to the enlarged process window for etching the slit opening for slit structure 122 as described below in detail with respect to the fabrication process.

In some embodiments, by doping polysilicon layer 104 with N-type dopants, i.e., eliminating a P-well as the source of holes, 3D memory device 100 is configured to generate gate-induced drain leakage (GIDL)-assisted body biasing when performing an erase operation, according to some embodiments. The GIDL around the source select gate of the NAND memory string can generate a hole current into the NAND memory string to raise the body potential for erase operations. Moreover, by eliminating a P-well as the source of holes, the control of the source select gate can be simplified during read operations as well since the inversion channel is no longer needed when performing read operations by 3D memory device 100.

Figure 1D:
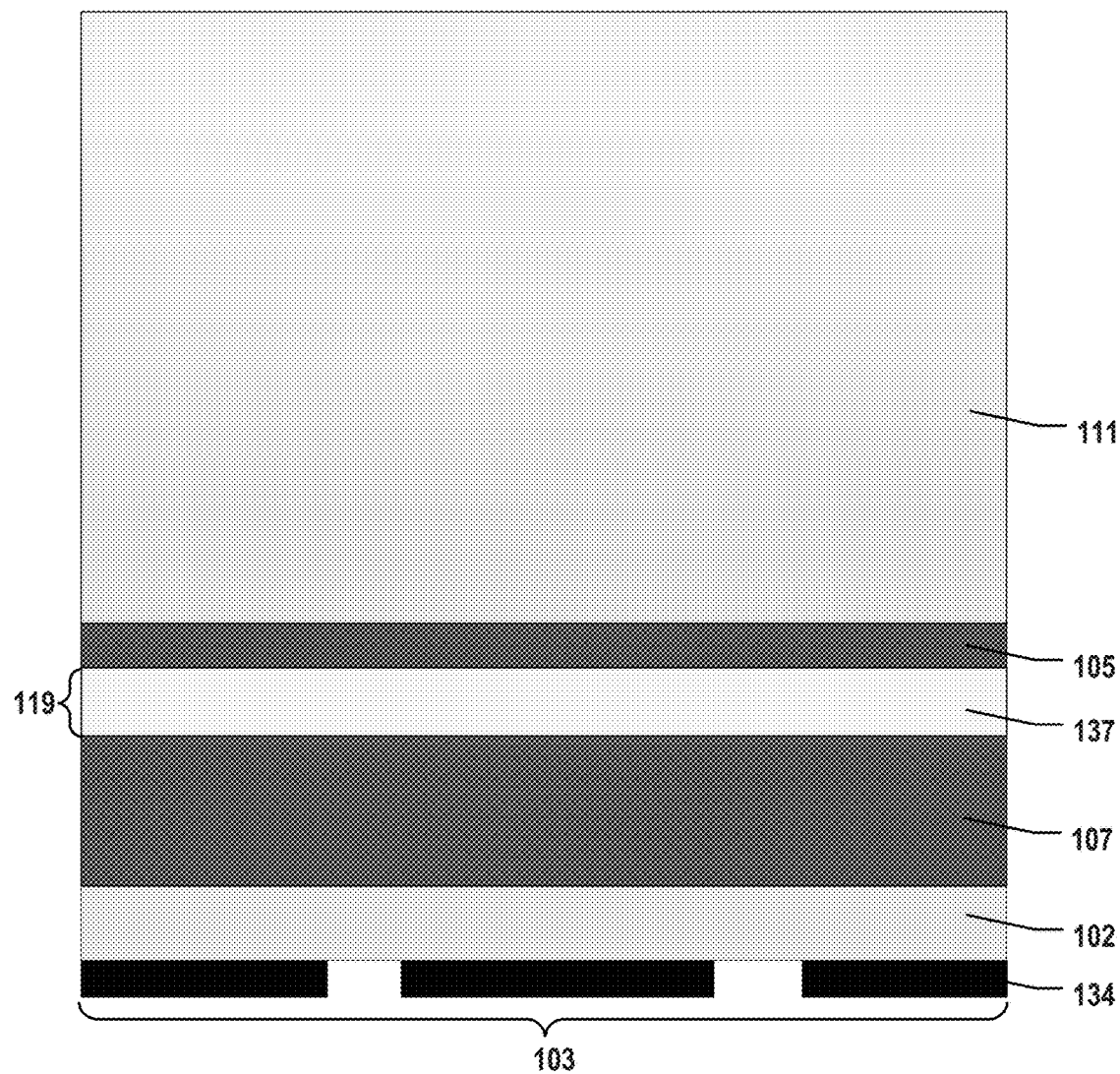
FIG. 1D illustrates a side view of a cross-section in another exemplary peripheral region of a 3D memory device, according to various embodiments of the present disclosure.
Figure 1E:
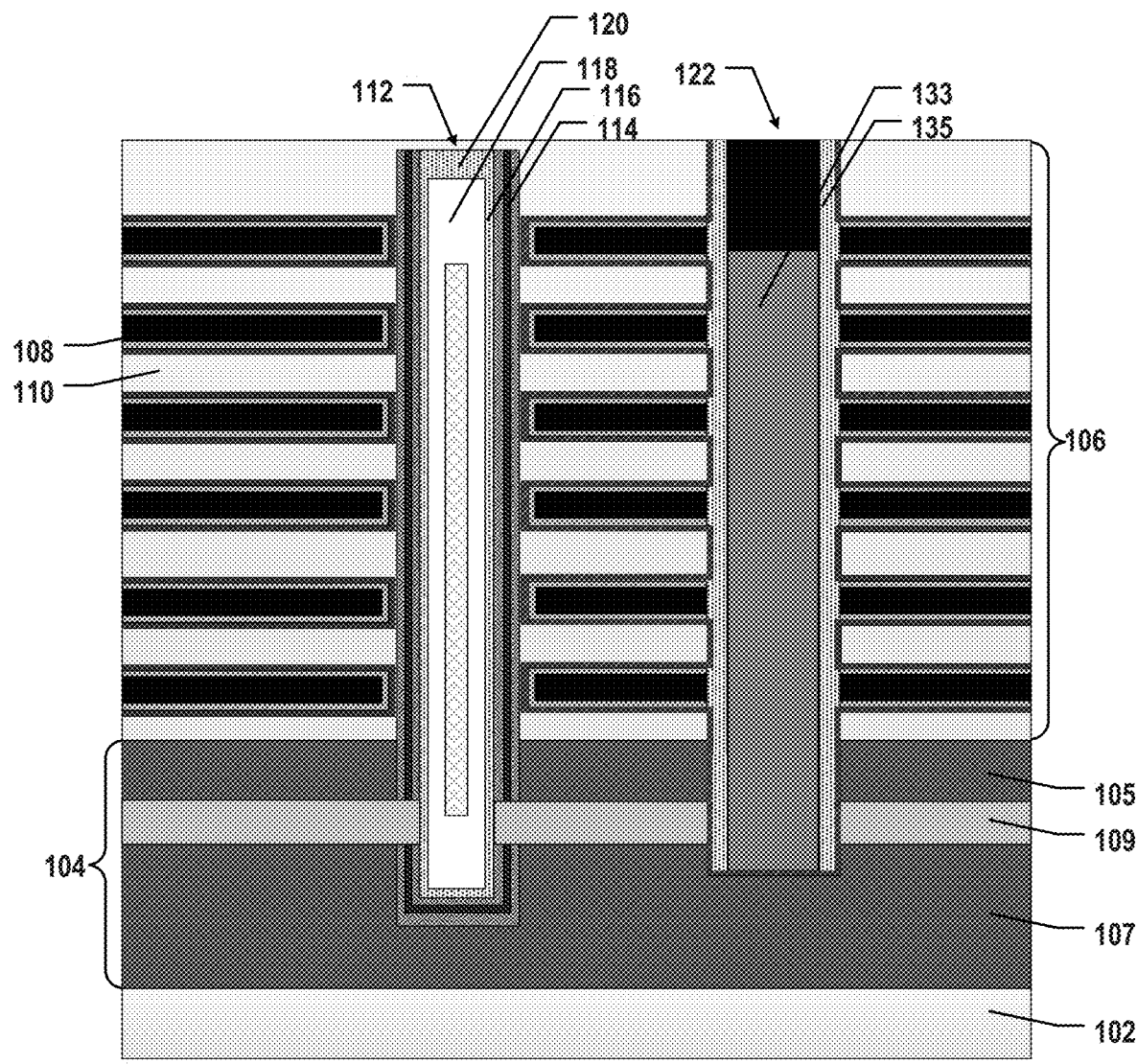
FIG. 1E illustrates a side view of a cross-section in another exemplary device region of a 3D memory device, according to various embodiments of the present disclosure.

It is understood that in some examples, slit structure 122 may include a source contact structure disposed at the same side of memory stack 106 (e.g., also known as "front side source pick up"). That is, instead of an insulating structure filled with dielectric materials as shown in FIG. 1A, slit structure 122 can be filled with conductive materials to become source contact structures. For example, as shown in FIG. 1E, slit structure 122 may be a source contact structure including a spacer 135 and a source contact 133 each extending vertically through memory stack 106 and into polysilicon layer 104. Spacer 135 can include dielectric materials, such as silicon oxide, laterally between source contact 133 and memory stack 106 to electrically separate source contact 133 from surrounding stack conductive layers 108 in memory stack 106. On the other hand, spacer 135 can be disposed along the sidewall of slit structure 122, but not at the bottom of slit structure 122, such that source contact 133 can be in contact with polysilicon layer 104 to make an electrical connection with semiconductor channel 116 of channel structure 112. In some embodiments, source contact 133 includes an adhesion layer and a conductive layer surrounded by the adhesion layer. The adhesion layer can include one or more conductive materials, such as titanium nitride (TiN), above and in contact with polysilicon layer 104 to make an electrical connection with polysilicon layer 104. In some embodiments, the conductive layer includes polysilicon in its lower portion and a metal (e.g., W) in its upper portion contacting a metal interconnect (not shown). In some embodiments, the adhesion layer (e.g., TiN) is in contact with both polysilicon layer 104 and the metal (e.g., W) of the conductive layer to form an electrical connection between polysilicon layer 104 (e.g., as the source of the NAND memory string) and the metal interconnect.

Referring to FIGS. 1A and 1B, part of polysilicon layer 104 excluding sublayer 109, i.e., upper and lower sublayers 105 and 107 can extend laterally into peripheral region 103 as well. In other words, each of upper and lower sublayers 105 or 107 can be a continuous layer, such as a continuous polysilicon layer, in device region 101 and peripheral region 103 of 3D memory device 100. As shown in FIG. 1B, 3D memory device 100 can include a dielectric sacrificial layer 119 sandwiched between upper and lower sublayers 105 and 107, i.e., part of polysilicon layer 104 excluding sublayer 109, in peripheral region 103. In some embodiments, dielectric sacrificial layer 119 is coplanar with sublayer 109. That is, sublayer 109 and dielectric sacrificial layer 119 are layers in different regions (e.g., device region 101 and peripheral region 103), but in the same plane (e.g., the AA' plane as shown in FIGS. 1A-1C), according to some embodiments. As described below in detail with respect to the fabrication process, sublayer 109 and dielectric sacrificial layer 119 originate from the same dielectric sacrificial layer extending laterally in both device region 101 and peripheral region 103, and part of the dielectric sacrificial layer in device region 101 is replaced by sublayer 109, while the part of the dielectric sacrificial layer in peripheral region 103 remains intact (as dielectric sacrificial layer 119) in the final product of 3D memory device 100.

In some embodiments as shown in FIG. 1B, dielectric sacrificial layer 119 is a composite dielectric layer including a first silicon oxide layer 127, a silicon nitride layer 129, and a second silicon oxide layer 131. That is, dielectric sacrificial layer 119 can include silicon nitride layer 129 sandwiched between first and second silicon oxide layers 127 and 131, which can relax the stress between silicon nitride in silicon nitride layer 129 and polysilicon in sublayers 107 and 105. It is understood that in some examples, dielectric sacrificial layer 119 may include a single silicon nitride layer 129 without silicon oxide layers 127 and 131. It is also understood that in some examples, dielectric sacrificial layer 119 may include a single silicon oxide layer 137, as shown in FIG. 1D. Nevertheless, dielectric sacrificial layer 119 in peripheral region 103 of 3D memory device 100 can include one or more dielectric materials, such as silicon nitride or silicon oxide. It is also understood that memory stack 106 in device region 101 may not extend laterally into peripheral region 103. Instead, as shown in FIG. 1B, 3D memory device 100 may include an ILD layer 111 above and in contact with upper sublayer 105 in peripheral region 103, which may be coplanar with memory stack 106 in device region 101.

Figure 2A:
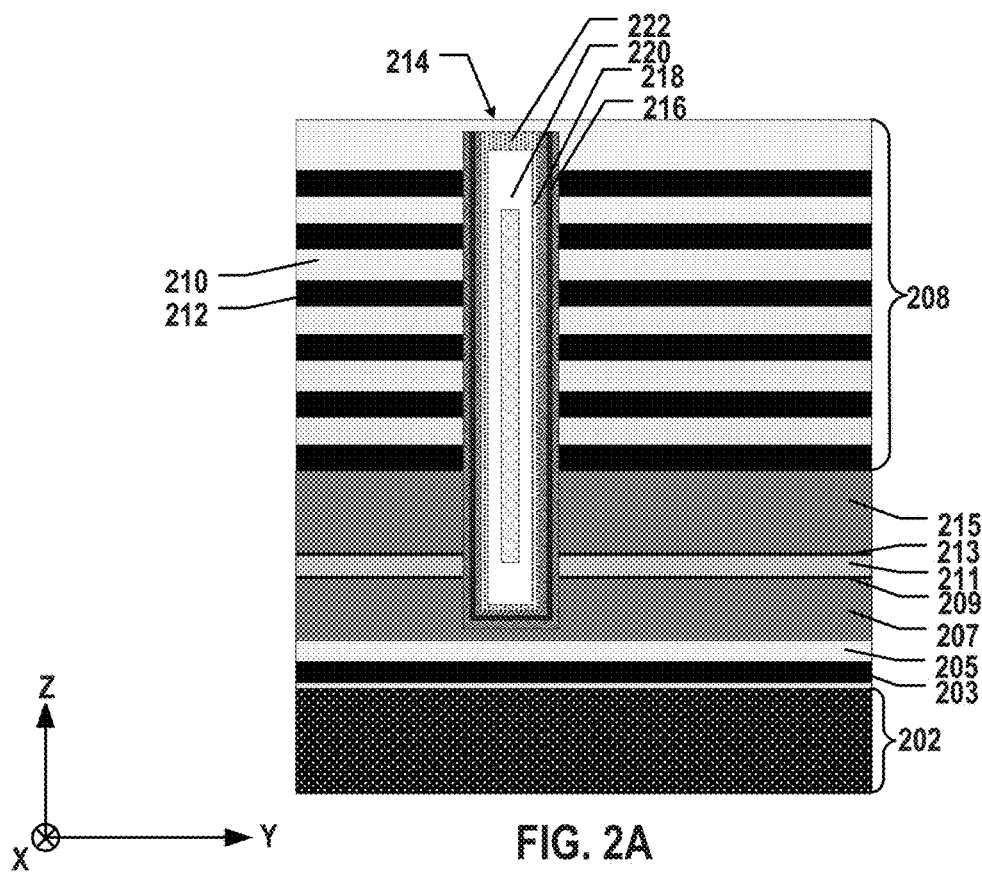
FIGS. 2A-2P illustrate a fabrication process for forming an exemplary 3D memory device, according to some embodiments of the present disclosure.
Figure 2B:
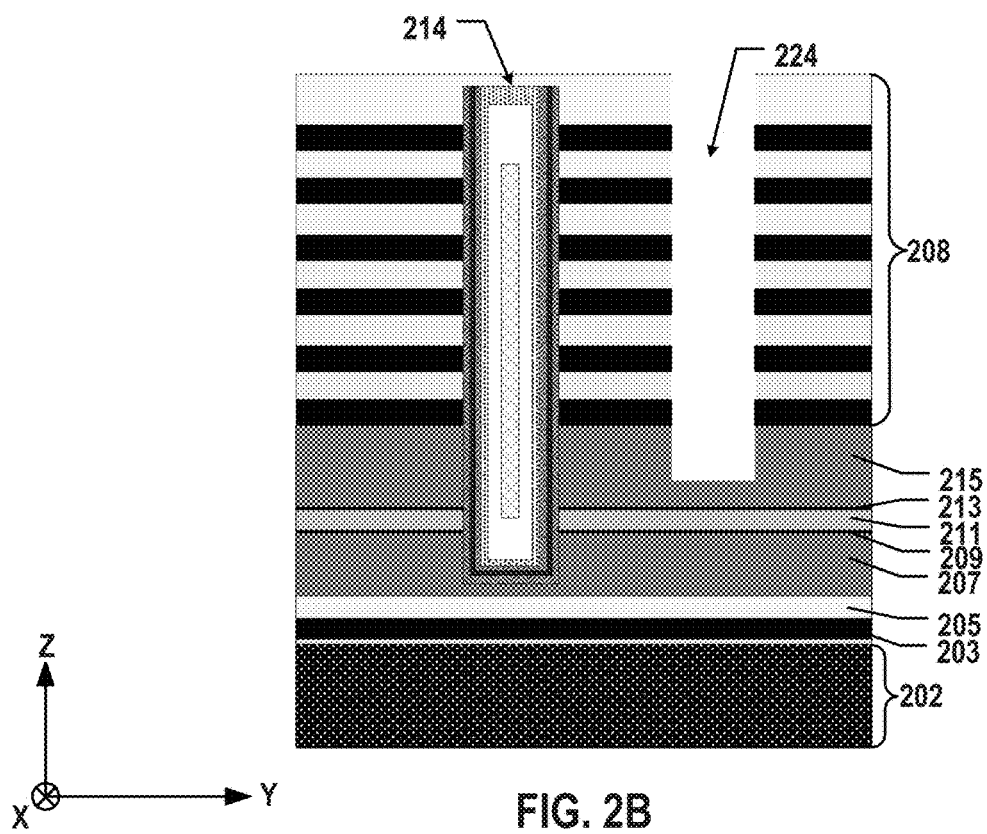
Figure 2C:
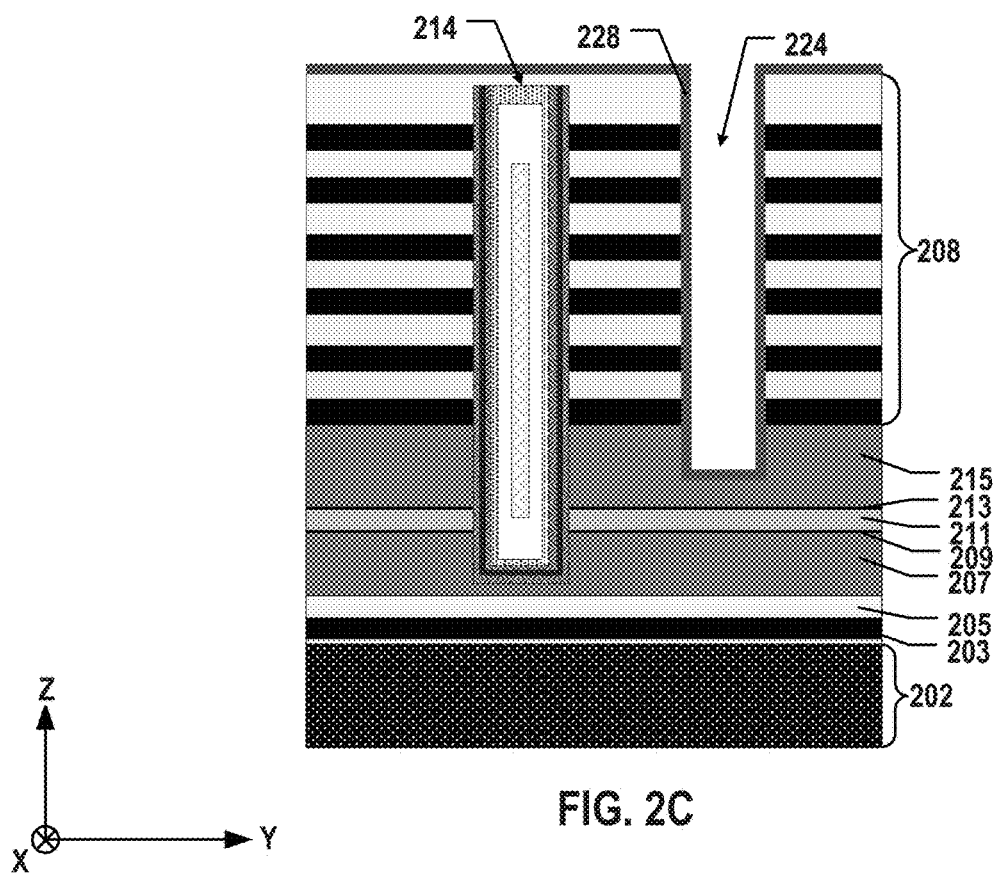
Figure 2D:
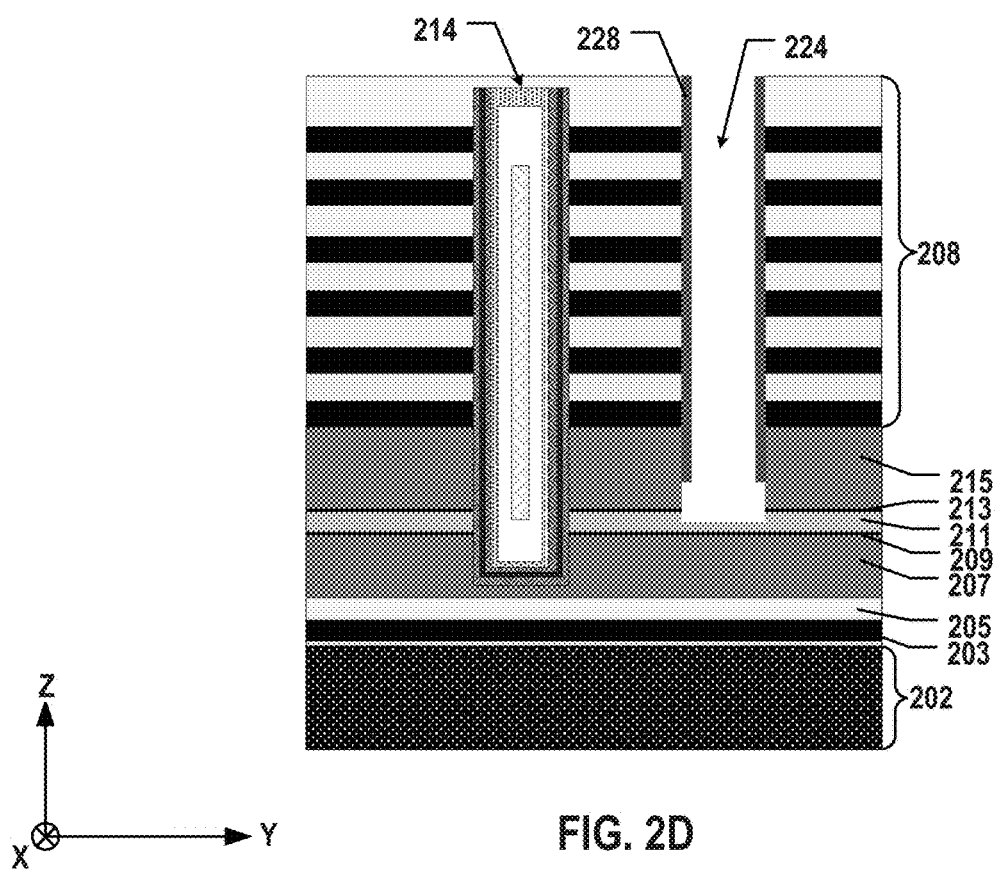
Figure 2E:
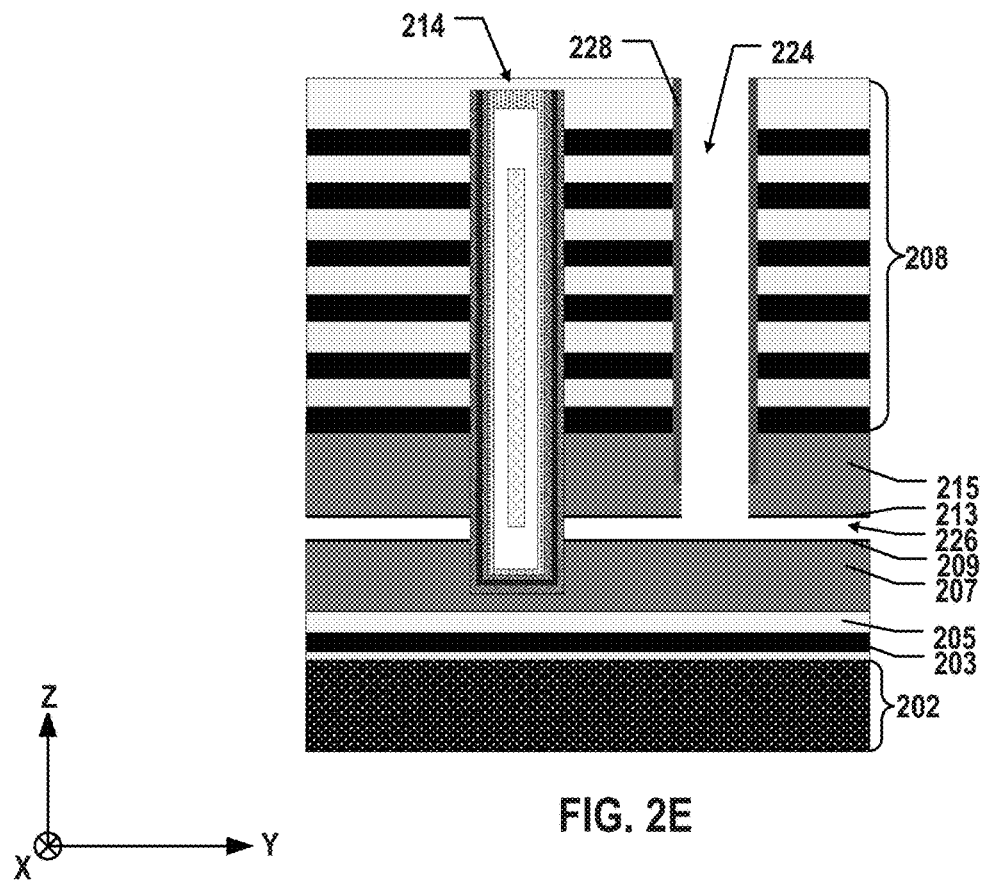
Figure 2F:
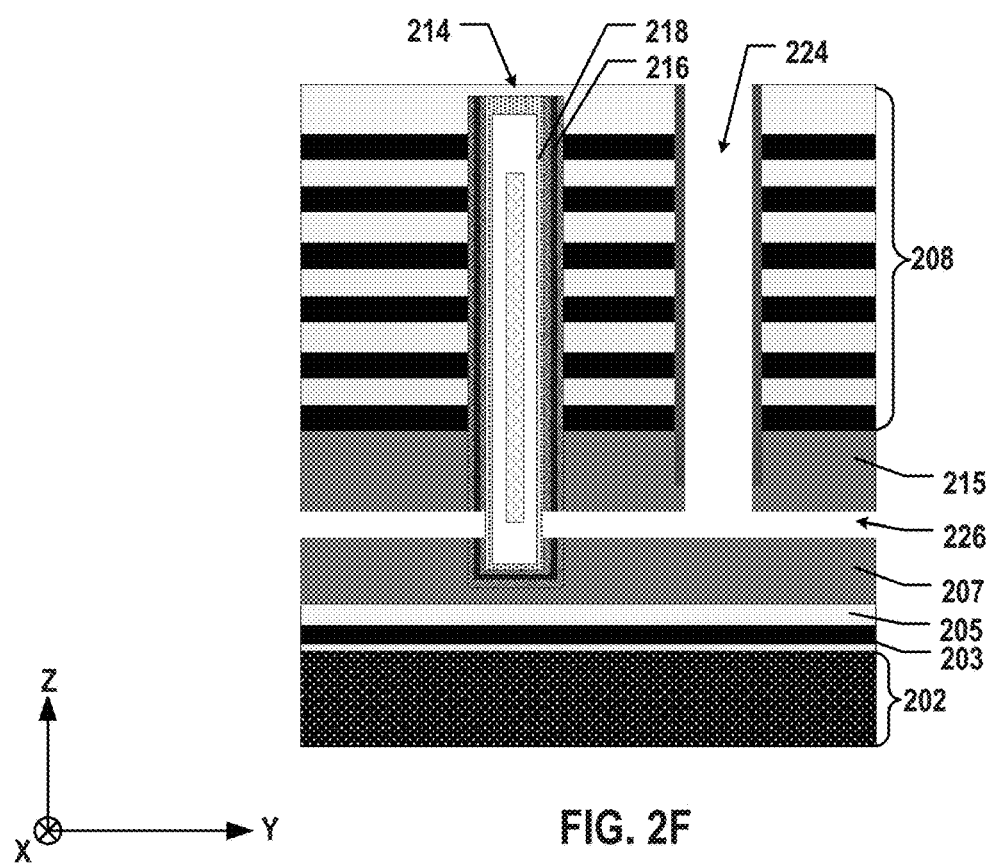
Figure 2G:
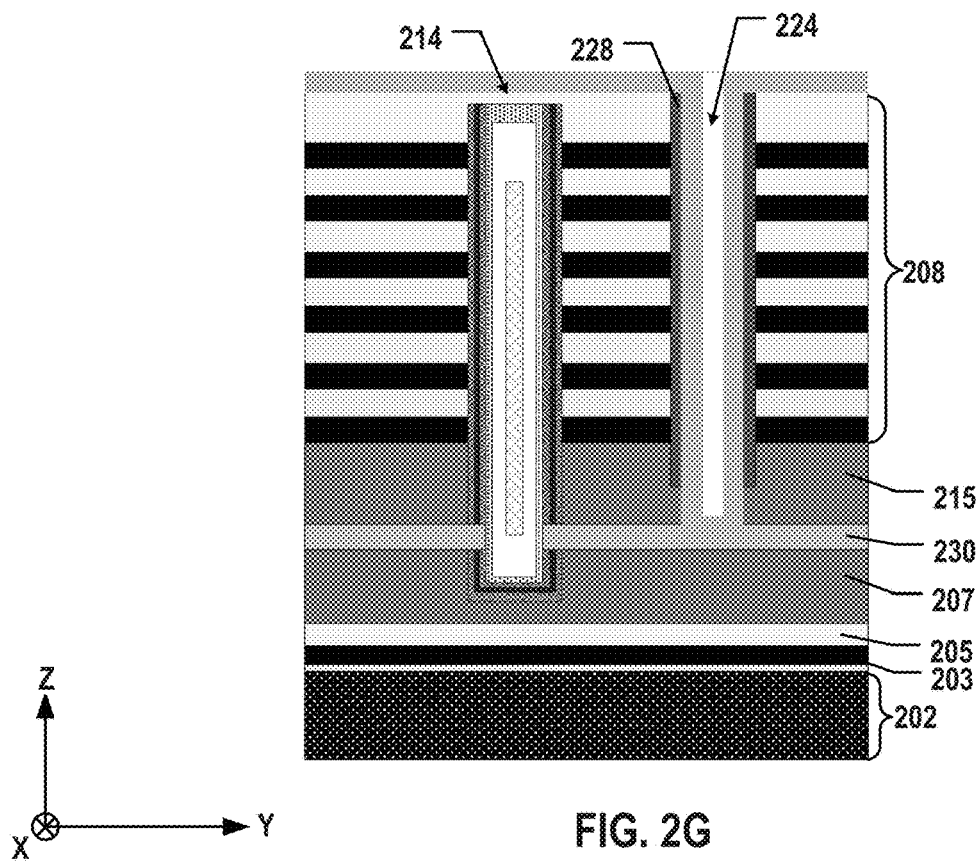
Figure 2H:
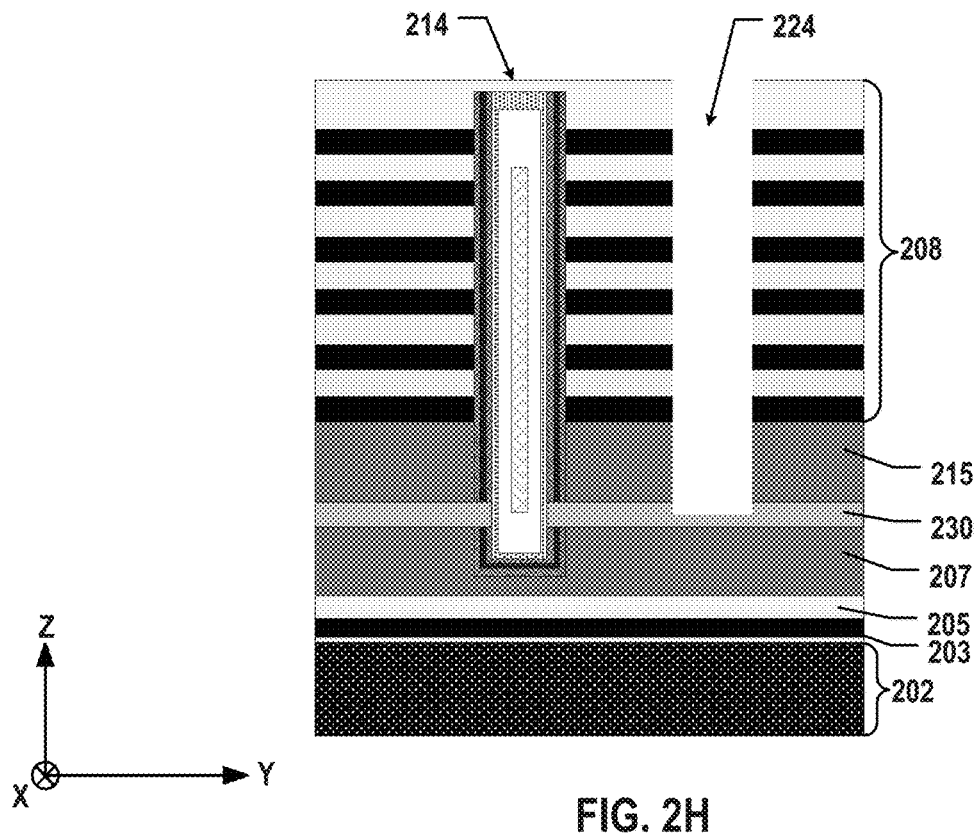
Figure 2I:
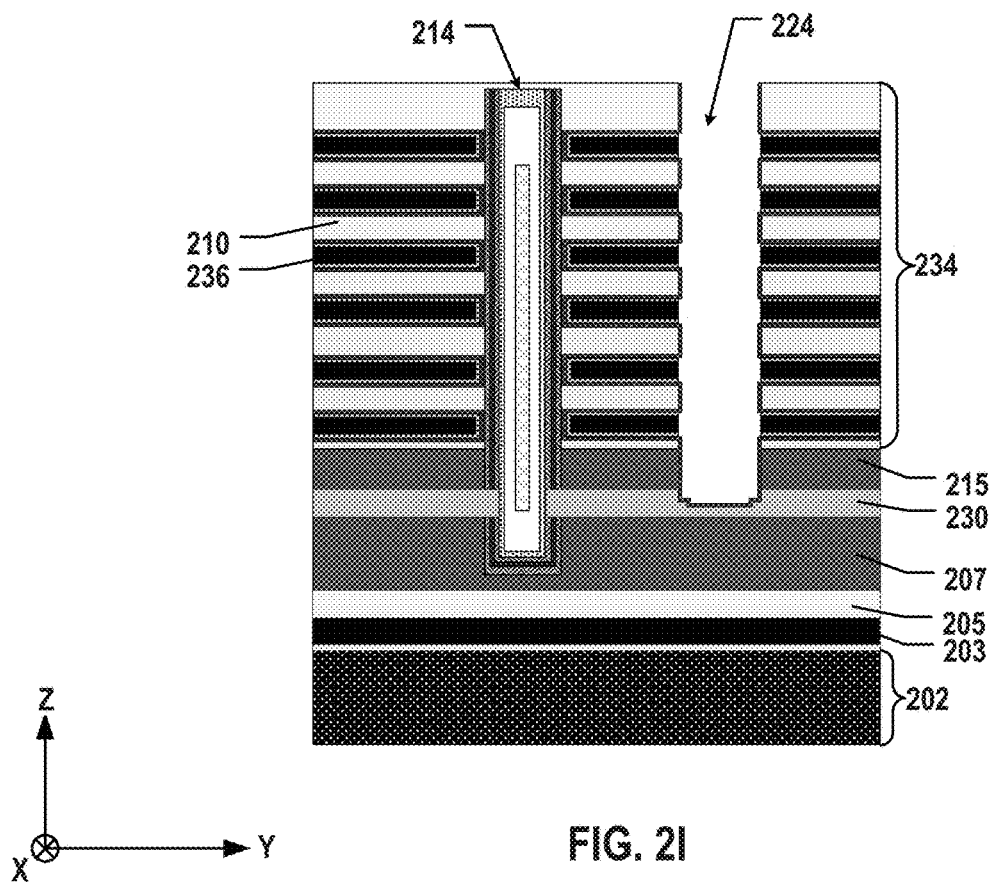
Figure 2J:
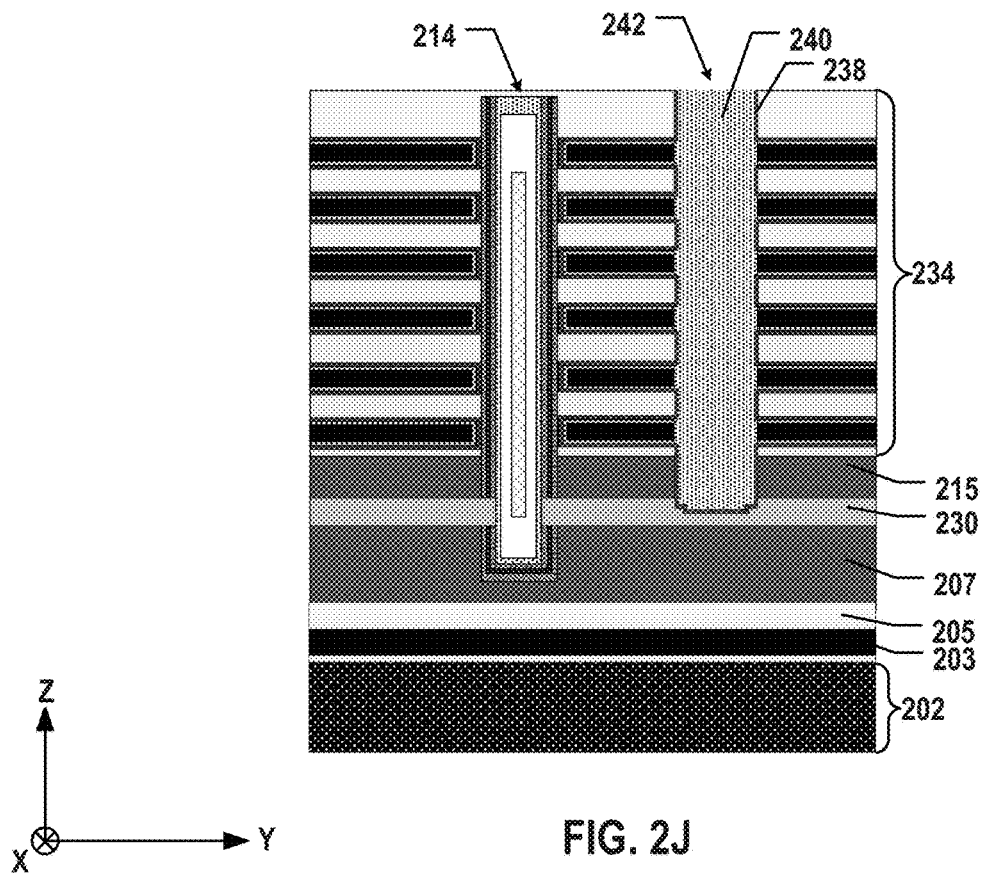
Figure 2K:
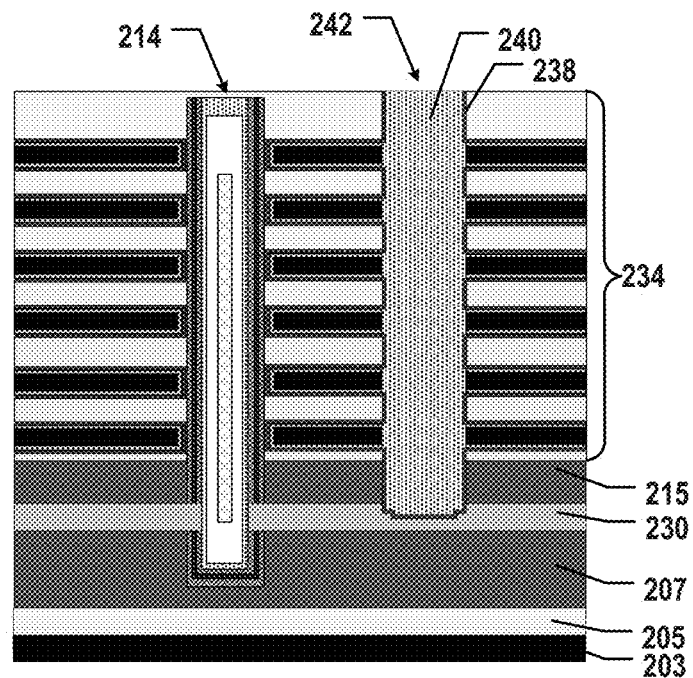
Figure 2L:
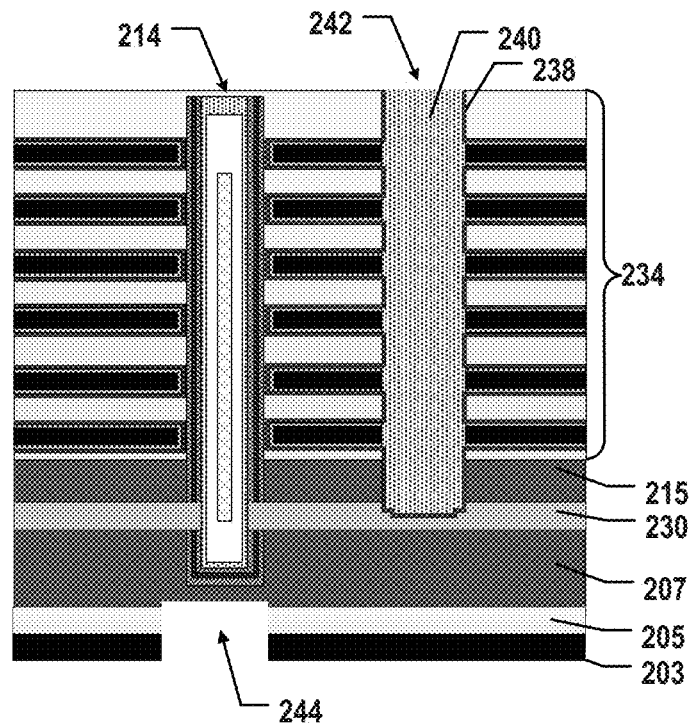
Figure 2M:
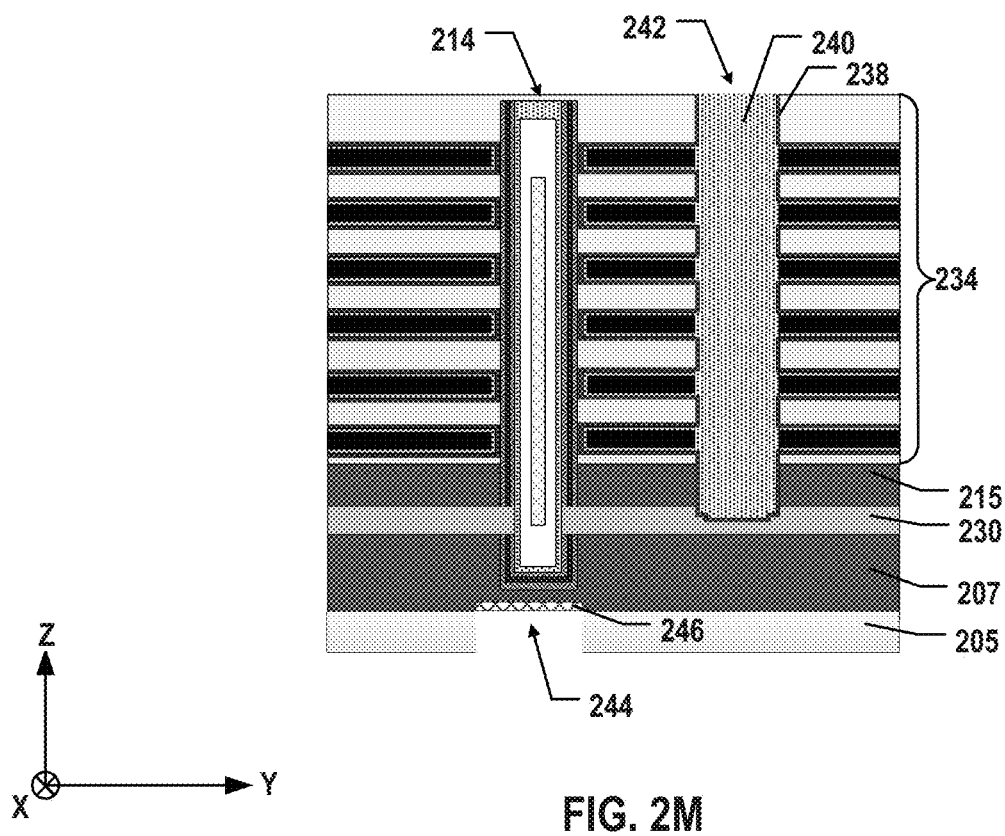
Figure 2N:
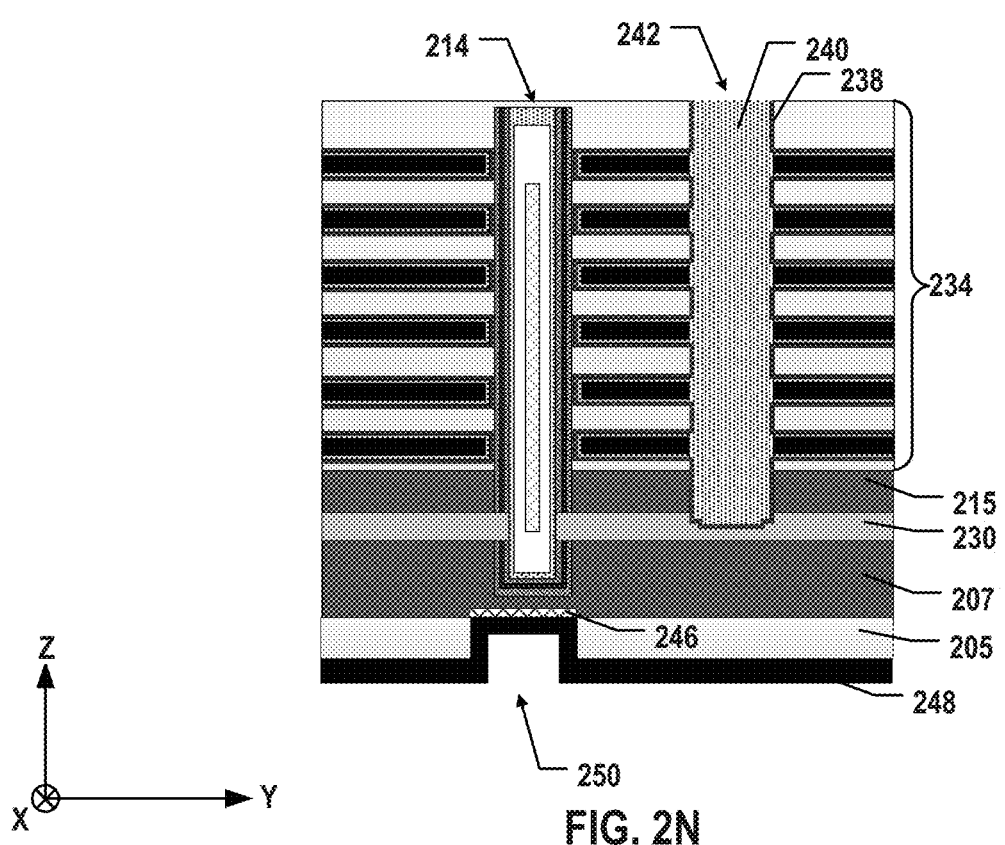
Figure 2O:
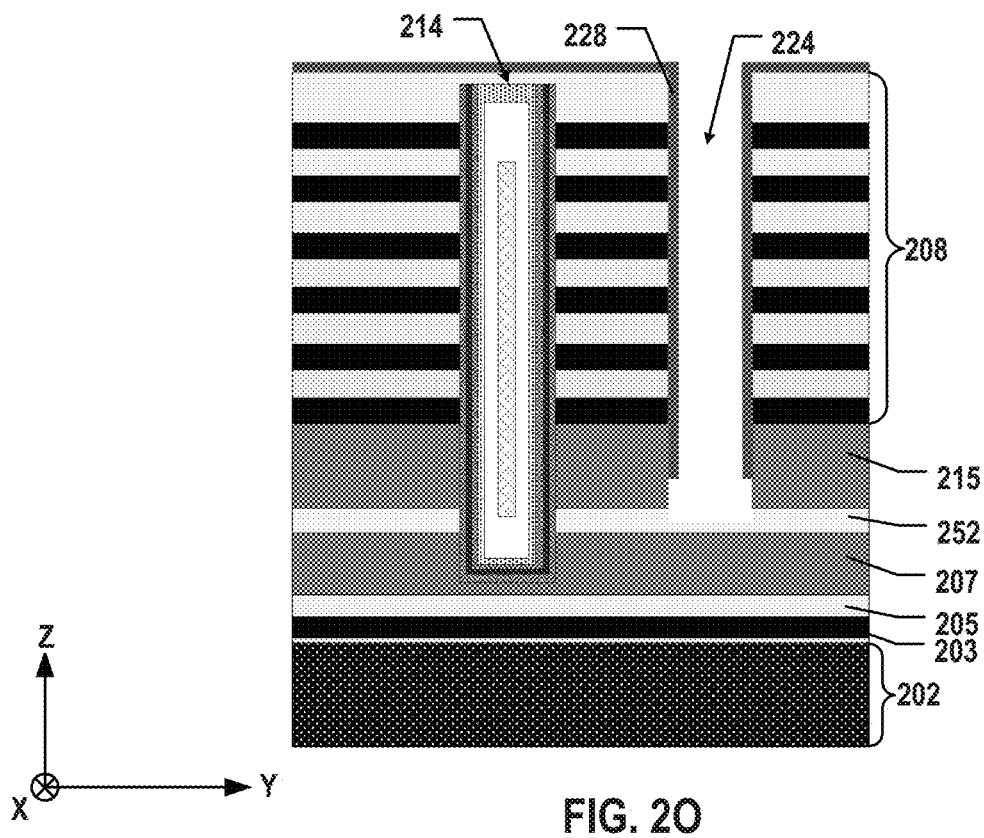
Figure 2P:
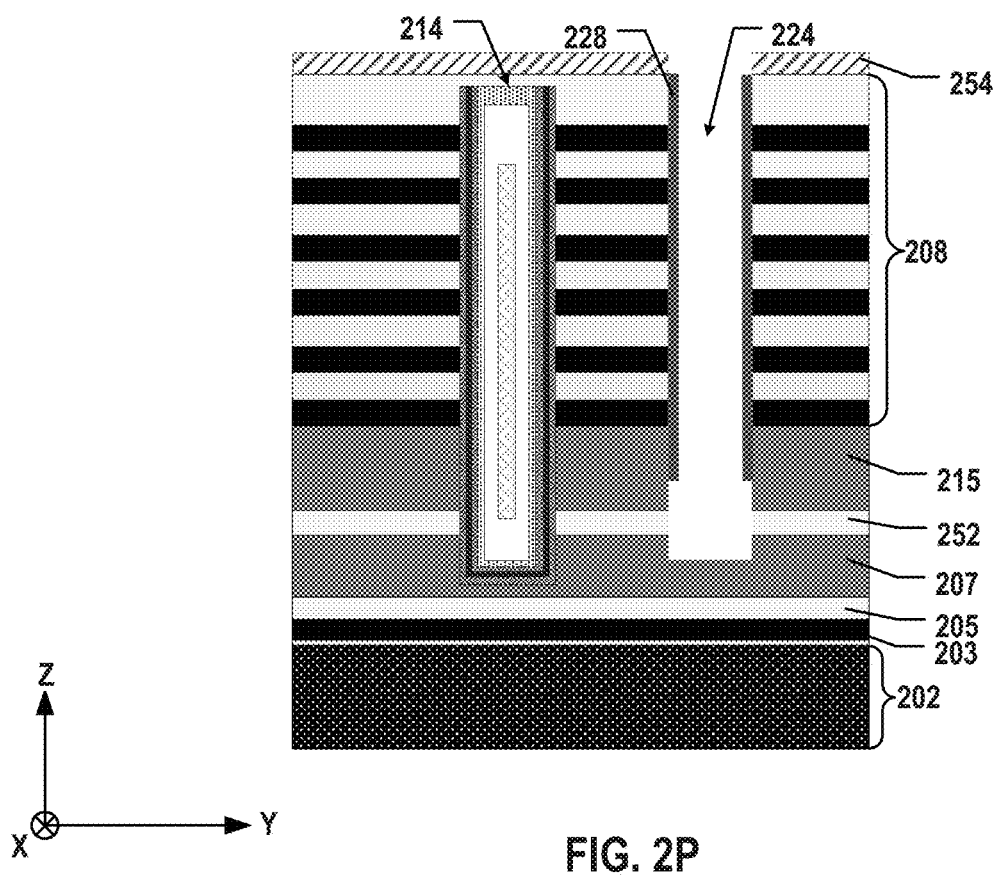
Figure 3:
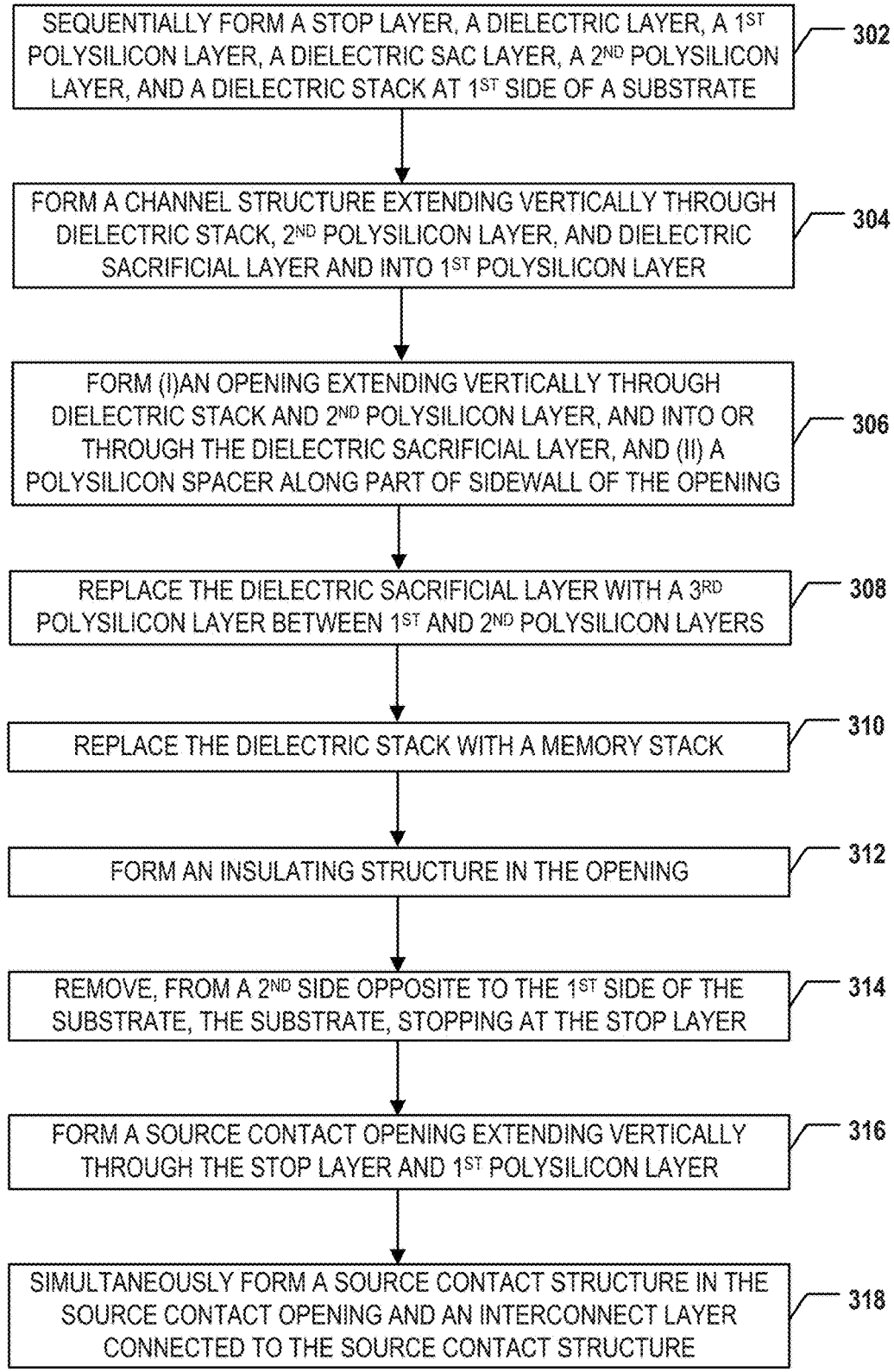
FIG. 3 illustrates a flowchart of a method for forming an exemplary 3D memory device, according to some embodiments of the present disclosure.

FIGS. 2A-2P illustrate a fabrication process for forming an exemplary 3D memory device, according to some embodiments of the present disclosure. FIG. 3 illustrates a flowchart of a method 300 for forming an exemplary 3D memory device, according to some embodiments of the present disclosure. Examples of the 3D memory device depicted in FIGS. 2A-2P and 3 include 3D memory device 100 depicted in FIGS. 1A-1C. FIGS. 2A-2P and 3 will be described together. It is understood that the operations shown in method 300 are not exhaustive and that other operations can be performed as well before, after, or between any of the illustrated operations. Further, some of the operations may be performed simultaneously, or in a different order than shown in FIG. 3.

Referring to FIG. 3, method 300 starts at operation 302, in which a stop layer, a dielectric layer, a first polysilicon layer, a dielectric sacrificial layer, a second polysilicon layer, and a dielectric stack are sequentially formed at a first side of a substrate. The substrate can be a silicon substrate or a carrier substrate, made of any suitable materials, such as glass, sapphire, plastic, to name a few, to reduce the cost of the substrate. The first side can be the front side of the substrate on which semiconductor devices can be formed. In some embodiments, to form the stop layer and the dielectric layer, a first silicon oxide layer, a first silicon nitride layer, and a second silicon oxide layer are sequentially deposited on the substrate. In some embodiments, to form the dielectric sacrificial layer, a third silicon oxide layer, a second silicon nitride layer, and a fourth silicon oxide layer are sequentially formed. In some embodiments, to form the dielectric sacrificial layer, a single silicon oxide layer is deposited. The dielectric stack can include a plurality of interleaved stack sacrificial layers and stack dielectric layers.

As illustrated in FIG. 2A, a stop layer 203, a dielectric layer 205, a first polysilicon layer 207, a first sacrificial layer 209, a second sacrificial layer 211, a third sacrificial layer 213, and a second polysilicon layer 215 are sequentially formed at the front side of a substrate 202. Substrate 202 can be a silicon substrate, or a carrier substrate made of any suitable materials, such as glass, sapphire, plastic, to name a few. In some embodiments, stop layer 203 and dielectric layer 205 include silicon nitride and silicon oxide, respectively. As described below in detail, stop layer 203 can act as the stop layer when removing substrate 202 from the backside and thus, may include any other suitable materials other than the material of substrate 202. It is understood that in some examples, a pad oxide layer (e.g., a silicon oxide layer) may be formed between substrate 202 and stop layer 203 to relax the stress therebetween.

First, second, and third sacrificial layers 209, 211, and 213 may be collectively referred to herein as a dielectric sacrificial layer. In some embodiments, first, second, and third sacrificial layers 209, 211, and 213 include silicon oxide, polysilicon, and silicon oxynitride, respectively. It is understood that in some examples, one or both of first and third sacrificial layers 209 and 213 may include silicon oxynitride. It is also understood that in some examples, first, second, and third sacrificial layers 209, 211, and 213 may be replaced by a single silicon oxide layer 252 as the dielectric sacrificial layer, for example, as shown in FIG. 2O, which is described below in detail. Nevertheless, different from knowns processes using polysilicon as the material of second sacrificial layers 211, the dielectric sacrificial layer disclosed herein, in particular second sacrificial layer 211, includes a dielectric material, such as silicon nitride or silicon oxide.

Referring back to FIG. 2A, stop layer 203, dielectric layer 205, first polysilicon layer 207, first sacrificial layer 209, second sacrificial layer 211, third sacrificial layer 213, and second polysilicon layer 215 (or any other layers therebetween) can be formed by sequentially depositing corresponding materials in this order in multiple cycles using one or more thin film deposition processes including, but not limited to, chemical vapor deposition (CVD), physical vapor deposition (PVD), atomic layer deposition (ALD), electroplating, electroless deposition, any other suitable deposition processes, or any combination thereof. In some embodiments, at least one of first and second polysilicon layers 207 and 215 is doped with N-type dopants, such as P, As, or Sb. In one example, the at least one of first and second polysilicon layers 207 and 215 may be doped using an ion implantation process after depositing polysilicon materials. In another example, in-situ doping of N-type dopants may be performed when depositing polysilicon to form the at least one of first and second polysilicon layers 207 and 215. It is understood that in some examples, none of first and second polysilicon layers 207 and 215 is doped with N-type dopants at this stage.

As illustrated in FIG. 2A, a dielectric stack 208 including a plurality pairs of a first dielectric layer (known as a "stack sacrificial layer 212") and a second dielectric layer (known as a "stack dielectric layer 210") is formed on second polysilicon layer 215. Dielectric stack 208 includes interleaved stack sacrificial layers 212 and stack dielectric layers 210, according to some embodiments. Stack dielectric layers 210 and stack sacrificial layers 212 can be alternatively deposited on second polysilicon layer 215 to form dielectric stack 208. In some embodiments, each stack dielectric layer 210 includes a layer of silicon oxide, and each stack sacrificial layer 212 includes a layer of silicon nitride. Dielectric stack 208 can be formed by one or more thin film deposition processes including, but not limited to, CVD, PVD, ALD, or any combination thereof. In some embodiments, a pad oxide layer (e.g., silicon oxide layer, not shown) is formed between second polysilicon layer 215 and dielectric stack 208.

Method 300 proceeds to operation 304, as illustrated in FIG. 3, in which a channel structure extending vertically through the dielectric stack, the second polysilicon layer, and the dielectric sacrificial layer and into the first polysilicon layer is formed. In some embodiments, to form the channel structure, a channel hole extending vertically through the dielectric stack, the second polysilicon layer, and the dielectric sacrificial layer and into the first polysilicon layer is formed, and a memory film and a semiconductor channel are sequentially formed along a sidewall of the channel hole. In some embodiments, a channel plug is formed above and in contact with the semiconductor channel.

As illustrated in FIG. 2A, a channel hole is an opening extending vertically through dielectric stack 208, second polysilicon layer 215, and sacrificial layers 213, 211, and 209, and into first polysilicon layer 207. In some embodiments, a plurality of openings are formed, such that each opening becomes the location for growing an individual channel structure 214 in the later process. In some embodiments, fabrication processes for forming the channel hole of channel structure 214 include wet etching and/or dry etching processes, such as deep-ion reactive etching (DRIE). The etching of the channel hole continues until extending into first polysilicon layer 207, according to some embodiments. In some embodiments, the etching conditions, such as etching rate and time, can be controlled to ensure that each channel hole has reached and stopped in first polysilicon layer 207 to minimize the gouging variations among the channel holes and channel structures 214 formed therein.

As illustrated in FIG. 2A, a memory film 216 (including a blocking layer, a storage layer, and a tunneling layer) and a semiconductor channel 218 are sequentially formed in this order along sidewalls and the bottom surface of the channel hole. In some embodiments, memory film 216 is first deposited along the sidewalls and bottom surface of the channel hole, and semiconductor channel 218 is then deposited over memory film 216. The blocking layer, storage layer, and tunneling layer can be subsequently deposited in this order using one or more thin film deposition processes, such as ALD, CVD, PVD, any other suitable processes, or any combination thereof, to form memory film 216. Semiconductor channel 218 can then be formed by depositing a semiconductor material, such as polysilicon, over the tunneling layer of memory film 216 using one or more thin film deposition processes, such as ALD, CVD, PVD, any other suitable processes, or any combination thereof. In some embodiments, a first silicon oxide layer, a silicon nitride layer, a second silicon oxide layer, and a polysilicon layer (a "SONO" structure) are subsequently deposited to form memory film 216 and semiconductor channel 218.

As illustrated in FIG. 2A, a capping layer 220 is formed in the channel hole and over semiconductor channel 218 to completely or partially fill the channel hole (e.g., without or with an air gap). Capping layer 220 can be formed by depositing a dielectric material, such as silicon oxide, using one or more thin film deposition processes, such as ALD, CVD, PVD, any other suitable processes, or any combination thereof. A channel plug 222 then can be formed in the upper portion of the channel hole. In some embodiments, parts of memory film 216, semiconductor channel 218, and capping layer 220 that are on the top surface of dielectric stack 208 are removed and planarized by CMP, wet etch, and/or dry etch processes. A recess then can be formed in the upper portion of the channel hole by wet etching and/or drying etching parts of semiconductor channel 218 and capping layer 220 in the upper portion of the channel hole. Channel plug 222 then can be formed by depositing semiconductor materials, such as polysilicon, into the recess by one or more thin film deposition processes, such as CVD, PVD, ALD, or any combination thereof. Channel structure 214 is thereby formed through dielectric stack 208, second polysilicon layer 215, and sacrificial layers 213, 211, and 209, and into first polysilicon layer 207, according to some embodiments.

Method 300 proceeds to operation 306, as illustrated in FIG. 3, in which (i) an opening extending vertically through the dielectric stack and the second polysilicon layer and into or through the dielectric sacrificial layer to expose part of the dielectric sacrificial layer, and (ii) a polysilicon spacer along part of the sidewall of the opening, are formed. In some embodiments, to form the opening and the polysilicon spacer, the opening extending vertically through the dielectric stack and into the second polysilicon layer is formed, the polysilicon spacer is formed along the sidewall of the opening, and the opening is extended further through the second polysilicon layer and into or through the dielectric sacrificial layer. In some embodiments, the polysilicon spacer abuts the dielectric stack but not the dielectric sacrificial layer.

As illustrated in FIG. 2B, a slit 224 is an opening formed that extends vertically through dielectric stack 208 and into second polysilicon layer 215. Slit 224 does not extend further through second polysilicon layer 215 into second sacrificial layer 211 at this stage, according to some embodiments. In some embodiments, fabrication processes for forming slit 224 include wet etch and/or dry etch processes, such as DRIE. In some embodiments, stack dielectric layers 210 and stack sacrificial layers 212 of dielectric stack 208 are first etched. The etching of dielectric stack 208 may not stop at the top surface of second polysilicon layer 215 and extend further into second polysilicon layer 215. In some embodiments, a second etching process can be performed to etch part of second polysilicon layer 215 before reaching third sacrificial layer 213, for example, by controlling the etch rate and/or etch time.

As illustrated in FIG. 2C, a polysilicon spacer 228 is formed along the sidewall and bottom surface of slit 224. In some embodiments, a layer of polysilicon is deposited into slit 224 and on dielectric stack 208 using one or more thin film deposition processes, such as CVD, PVD, ALD, or any combination thereof, to form polysilicon spacer 228. Different from known processes using a complicated spacer structure, such as a composite dielectric layer having multiple sublayers of different dielectric materials, polysilicon spacer 228 includes a single polysilicon layer, which can be used in combination with the dielectric sacrificial layer including silicon nitride (e.g., second sacrificial layer 211) or silicon oxide.

As illustrated in FIG. 2D, slit 224 is extended further into second sacrificial layer 211 to expose part of second sacrificial layer 211. As a result, polysilicon spacer 228 abuts dielectric stack 208 but not sacrificial layer 213, 211, or 209, according to some embodiments. That is, polysilicon spacer 228 can protect dielectric stack 208 during the later processes before being removed and, at the same time, does not block the passageway to second sacrificial layer 211 through slit 224. In some embodiments, part of polysilicon spacer 228 at the bottom surface of slit 224 is first etched, for example, using RIE, to expose part of second polysilicon layer 215 through slit 224. Slit 224 can then be extended further by etching slit 224 again in the vertical direction. It is understood that the process window of the second etch process applied to slit 224 may be relatively large as etching may be stopped either within second sacrificial layer 211 (e.g., shown in FIG. 2D) or through sacrificial layers 213, 211, and 209 into first polysilicon layer 207 (not shown) as long as part of second sacrificial layer 211 can be exposed through slit 224 after the second etch process. In other words, the second etch process applied to slit 224 can create a passageway to sacrificial layer 213, 211, or 209 through slit 224 as well as polysilicon spacer 228 covering dielectric stack 208 but not sacrificial layer 211.

As illustrated in FIGS. 2O and 2P, in some embodiments in which the dielectric sacrificial layer includes single silicon oxide layer 252, the similar etching processes for forming slit 224 and deposition process for forming polysilicon spacer 228 may be applied as well to form slit 224 extending vertically through dielectric stack 208 and second polysilicon layer 215 and into silicon oxide layer 252 (e.g., shown in FIG. 2O) or through silicon oxide layer 252 into first polysilicon layer 207 (e.g., shown in FIG. 2P), as well as to form polysilicon spacer 228 along part of the sidewall of slit 224 that abuts dielectric stack 208 but not silicon oxide layer 252. It is understood that in performing the second etch process to extend slit 224, etch part of polysilicon spacer 228 at the bottom surface of slit 224 may also remove part of polysilicon spacer 228 on dielectric stack 208 (e.g., shown in FIG. 2D). In some embodiments in which the dielectric sacrificial layer includes single silicon oxide layer 252, to protect dielectric stack 208 that also includes silicon oxide at the top of dielectric stack 208, a protection layer is formed on dielectric stack 208 when etching slit 224 into or through silicon oxide layer 252. In one example as shown in FIG. 2O, part of polysilicon spacer 228 on dielectric stack 208 may remain after removing part of polysilicon spacer 228 at the bottom surface of slit 224, for example, by controlling the angle, direction, and/or range of the etch process, or by covering part of polysilicon spacer 228 on dielectric stack 208 during the etch process. In another example as shown in FIG. 2P, an etch mask 254, such as a soft mask and/or a hard mask, may be formed on dielectric stack 208 after part of polysilicon spacer 228 on dielectric stack 208 is removed.

Method 300 proceeds to operation 308, as illustrated in FIG. 3, in which the dielectric sacrificial layer is replaced, through the opening, with a third polysilicon layer between the first and second polysilicon layers. In some embodiments, to replace the dielectric sacrificial layer with the third polysilicon layer, the sacrificial layer is removed, through the opening, to form a cavity between the first and second polysilicon layers, part of the memory film is removed, through the opening, to expose part of the semiconductor channel along the sidewall of the channel hole, and polysilicon is deposited, through the opening, into the cavity to form the third polysilicon layer. In some embodiments, at least one of the first, second, and third polysilicon layers is doped with an N-type dopant. The N-type dopant can be diffused in the first, second, and third polysilicon layers.

As illustrated in FIG. 2E, sacrificial layer 211 (e.g., shown in FIG. 2D) is removed by wet etching and/or dry etching to form a cavity 226. In some embodiments, second sacrificial layer 211 includes silicon nitride, polysilicon spacer 228 includes polysilicon, first and third sacrificial layers 209 and 203 each includes silicon oxide, and second sacrificial layer 211 is etched by applying an etchant having phosphoric acid through slit 224, which can be stopped by polysilicon spacer 228. That is, the removal of second sacrificial layer 211 does not affect dielectric stack 208 protected by polysilicon spacer 228, according to some embodiments. Similarly, silicon oxide layer 252 (as the dielectric sacrificial layer) in FIGS. 2O and 2P may be removed by applying an etchant having hydrofluoric acid through slit 224, which can be stopped by polysilicon spacer 228.

As illustrated in FIG. 2F, part of memory film 216 exposed in cavity 226 is removed to expose part of semiconductor channel 218 along the sidewall of channel structure 214. In some embodiments, parts of the blocking layer (e.g., including silicon oxide), storage layer (e.g., including silicon nitride), and tunneling layer (e.g., including silicon oxide) are etched by applying etchants through slit 224 and cavity 226, for example, phosphoric acid for etching silicon nitride and hydrofluoric acid for etching silicon oxide. The etching can be stopped by polysilicon spacer 228 and semiconductor channel 218. That is, the removal of part of memory film 216 exposed in cavity 226 does not affect dielectric stack 208 (protected by polysilicon spacer 228) and semiconductor channel 218 including polysilicon and capping layer 220 enclosed by semiconductor channel 218, according to some embodiments. In some embodiments, first and third sacrificial layers 209 and 213 (including silicon oxide) are removed as well by the same etching process.

As illustrated in FIG. 2G, a third polysilicon layer 230 is formed between first and second polysilicon layers 207 and 215. In some embodiments, third polysilicon layer 230 is formed by depositing polysilicon into cavity 226 (shown in FIG. 2F) through slit 224 using one or more thin film deposition processes, such as CVD, PVD, ALD, or any combination thereof. In some embodiments, in-situ doping of N-type dopants, such as P, As, or Sb, is performed when depositing polysilicon to form third polysilicon layer 230. Third polysilicon layer 230 can fill cavity 226 to be in contact with the exposed part of semiconductor channel 218 of channel structure 214. It is understood that third polysilicon layer 230 may be doped or un-doped depending on whether at least one of first and second polysilicon layers 207 and 215 are doped with N-type dopants since at least one of first, second, and third polysilicon layers 207, 215, and 230 may need to be doped with N-type dopants. In some embodiments, the N-type dopants in at least one of first, second, and third polysilicon layers 207, 215, and 230 is diffused in first, second, and third polysilicon layers 207, 215, and 230 to achieve a uniform doping concentration profile in the vertical direction among first, second, and third polysilicon layers 207, 215, and 230 using thermal diffusion process, such as annealing. For example, the doping concentration may be between $10^{19}$ cm$^{-3}$ and $10^{22}$ cm$^{-3}$ after diffusion. As described above, the interfaces between first, second, and third polysilicon layers 207, 215, and 230 may become indistinguishable as each of first, second, and third polysilicon layers 207, 215, and 230 includes the same polysilicon material with nominally the same doping concentration. Thus, first, second, and third polysilicon layers 207, 215, and 230 may be collectively viewed as a polysilicon layer after diffusion.

Although not shown, it is understood that in some examples, the dielectric sacrificial layer (e.g., sacrificial layers 209, 211, and 213, or silicon oxide layer 252) may be replaced with third polysilicon layer 230 only in the memory region of the 3D memory device, but not in the peripheral region of the 3D memory device, for example, by forming slits 224 only in the memory region, but not the peripheral region of the 3D memory device, and controlling the etching of the dielectric sacrificial layer not to extend to the peripheral region. As a result, the part of the dielectric sacrificial layer (e.g., sacrificial layers 209, 211, and 213, or silicon oxide layer 252) in the peripheral region may still remain in the final product of the 3D memory device after fabrication.

As illustrated in FIG. 2H, parts of third polysilicon layer 230 (e.g., shown in FIG. 2G) along the sidewall of slit 224 and on dielectric stack 208 as well as polysilicon spacer 228 (e.g., shown in FIG. 2G) are removed, for example, using dry etching and/or wet etching, to expose dielectric stack 208 through slit 224. The etching process can be controlled (e.g., by controlling the etching rate and/or time), such that third polysilicon layer 230 still remains between first and second polysilicon layers 207 and 215 and in contact with semiconductor channel 218 of channel structure 214.

Method 300 proceeds to operation 310, as illustrated in FIG. 3, in which the dielectric stack is replaced, through the opening, with a memory stack using the so-called "gate replacement process." As illustrated in FIG. 2I, a memory stack 234 can be formed by a gate replacement process, i.e., replacing stack sacrificial layers 212 with stack conductive layers 236. Memory stack 234 thus can include interleaved stack conductive layers 236 and stack dielectric layers 210 on second polysilicon layer 215. In some embodiments, to form memory stack 234, stack sacrificial layers 212 are removed by applying etchants through slit 224 to form a plurality of lateral recesses. Stack conductive layers 236 then can be deposited into the lateral recesses by depositing one or more conductive materials using one or more thin film deposition processes, such as PVD, CVD, ALD, or any combinations thereof. Channel structure 214 thereby extends vertically through memory stack 234 and into the polysilicon layer including first, third, and second polysilicon layers 215, 230, and 207, according to some embodiments.

Method 300 proceeds to operation 312, as illustrated in FIG. 3, in which an insulating structure is formed in the opening. In some embodiments, to form the insulating structure, one or more dielectric materials are deposited into the opening to fill the opening.

As illustrated in FIG. 2J, an insulating structure 242 is formed in slit 224 (e.g., shown in FIG. 2I). Insulating structure 242 can be formed by depositing one or more dielectric materials, such as high-k dielectrics (also as a gate dielectric layer 238) and silicon oxide as an insulating core 240, in slit 224 to completely or partially fill slit 224 with or without air gap using one or more thin film deposition processes, such as PVD, CVD, ALD, or any combinations thereof.

Method 300 proceeds to operation 314, as illustrated in FIG. 3, in which the substrate is removed, from a second side opposite to the first side of the substrate, stopping at the stop layer. The second side can be the backside of the substrate.

As illustrated in FIG. 2K, substrate 202 (e.g., shown in FIG. 2J) is removed from the backside. Although not shown in FIG. 2K, it is understood that the intermediate structure in FIG. 2J may be flipped upside down to have substrate 202 on the top of the intermediate structure. In some embodiments, substrate 202 is completely removed using CMP, grinding, wet etching, and/or dry etching until being stopped by stop layer 203 (e.g., a silicon nitride layer). In some embodiments, substrate 202 (a silicon substrate) is removed using silicon CMP, which is automatically stopped when reaching stop layer 203 having materials other than silicon, i.e., acting as a backside CMP stop layer. In some embodiments, substrate 202 (a silicon substrate) is removed using wet etching by tetramethylammonium hydroxide (TMAH), which is automatically stopped when reaching stop layer 203 having materials other than silicon, i.e., acting as a backside etch stop layer. Stop layer 203 can ensure the complete removal of substrate 202 without the concern of thickness uniformity after thinning.

Method 300 proceeds to operation 316, as illustrated in FIG. 3, in which a source contact opening extending vertically through the stop layer and the dielectric layer is formed to expose part of the first polysilicon layer. As illustrated in FIG. 2L, a source contact opening 244 extends vertically through stop layer 203 and dielectric layer 205 to expose part of first polysilicon layer 207. Source contact opening 244 can be formed using dry etching and/or wet etching, such as RIE, to etch stop layer 203 and dielectric layer 205. It is understood that in some examples, the etching may continue into first polysilicon layer 207 to remove part of first polysilicon layer 207.

Method 300 proceeds to operation 318, as illustrated in FIG. 3, in which a source contact structure in the source contact opening and an interconnect layer connected to the source contact structure are simultaneously formed. In some embodiments, to simultaneously form the source contact structure and the interconnect layer, a silicide layer is formed in the source contact opening in contact with the exposed part of the first polysilicon layer, the stop layer is removed to expose the dielectric layer, and a metal layer is deposited into the source contact opening and on the dielectric layer.

As illustrated in FIG. 2M, a silicide layer 246 is formed at the bottom surface of source contact opening 244 in contact with first polysilicon layer 207. Silicide layer 246, such as NiSi, can be formed by depositing a metal layer, such as Ni, into source contact opening 244 to be in contact with first polysilicon layer 207, followed by an annealing process. As illustrated in FIG. 2M, stop layer 203 is removed using wet etching and/or dry etching to expose dielectric layer 205. The formation of silicide layer 246 can be performed prior to or after the removal of stop layer 203. It is understood that in some examples, the formation of silicide layer 246 may be skipped.

As illustrated in FIG. 2N, a metal layer, such as an Al layer, is deposited into source contact opening 244 on silicide layer 246 as well as on dielectric layer 205 using one or more thin film deposition processes, such as PVD, CVD, ALD, or any combinations thereof, to simultaneously form an interconnect layer 248 and a source contact structure 250 including silicide layer 246 and the metal layer (i.e., part of interconnect layer 248) in the same process. As a result, interconnect layer 248 is connected to source contact structure 250, according to some embodiments. Although not shown, it is understood that in some examples, interconnect layer 248 may be patterned to form contact pads in the peripheral region of the 3D memory device.

Although not shown, it is understood that in some examples, prior to removing the substrate, a front side source contact structure may be formed in the opening, e.g., slit 224, by depositing one or more conductive materials in the opening using one or more thin film deposition processes, such as PVD, CVD, ALD, or any combinations thereof. The front side source contact structure may replace the backside source contact structure, e.g., source contact structure 250, and the front side insulating structure, e.g., insulating structure 242.

According to one aspect of the present disclosure, a method for forming a 3D memory device is disclosed. A first polysilicon layer, a dielectric sacrificial layer, a second polysilicon layer, and a dielectric stack are sequentially formed above a substrate. A channel structure extending vertically through the dielectric stack, the second polysilicon layer, and the dielectric sacrificial, and into the first polysilicon layer is formed. An opening extending vertically through the dielectric stack and the second polysilicon layer, and extending vertically into or through the dielectric sacrificial layer to expose part of the dielectric sacrificial layer, and a polysilicon spacer along part of a sidewall of the opening are formed. The dielectric sacrificial layer is replaced, through the opening, with a third polysilicon layer between the first and second polysilicon layers.

In some embodiments, to form the opening and the polysilicon spacer, the opening extending vertically through the dielectric stack and into the second polysilicon layer is formed, the polysilicon spacer is formed along the sidewall of the opening, and the opening is extended further through the second polysilicon layer and into or through the dielectric sacrificial layer.

In some embodiments, the polysilicon spacer abuts the dielectric stack but not the dielectric sacrificial layer.

In some embodiments, after replacing the dielectric layer with the third polysilicon layer, the dielectric stack is replaced, through the opening, with a memory stack.

In some embodiments, after replacing the dielectric stack with the memory stack, a slit structure is formed in the opening.

In some embodiments, to form the dielectric sacrificial layer, a first silicon oxide layer, a silicon nitride layer, and a second silicon oxide layer are sequentially deposited.

In some embodiments, to form the dielectric sacrificial layer, a single silicon oxide layer is deposited.

In some embodiments, to form the channel structure, a channel hole extending vertically through the dielectric stack, the second polysilicon layer, and the dielectric sacrificial layer, and into the first polysilicon layer is formed, and a memory film and a semiconductor channel are sequentially formed along a sidewall of the channel hole.

In some embodiments, to replace the dielectric sacrificial layer with the third polysilicon layer, the dielectric sacrificial layer is removed, through the opening, to form a cavity between the first and second polysilicon layers, part of the memory film is removed, through the opening, to expose part of the semiconductor channel along the sidewall of the channel hole, and polysilicon is deposited, through the opening, into the cavity to form the third polysilicon layer.

In some embodiments, at least one of the first, second, and third polysilicon layers is doped with an N-type dopant. In some embodiments, the N-type dopant is diffused in the first, second, and third polysilicon layers.

According to another aspect of the present disclosure, a method for forming a 3D memory device is disclosed. A stop layer, a dielectric layer, a first polysilicon layer, a dielectric sacrificial layer, a second polysilicon layer, and a dielectric stack are sequentially formed at a first side of a substrate. A channel structure extending vertically through the dielectric stack, the second polysilicon layer, and the dielectric sacrificial, and into the first polysilicon layer is formed. An opening extending vertically through the dielectric stack and the second polysilicon layer and extending vertically into or through the dielectric sacrificial layer is formed to expose part of the dielectric sacrificial layer. The dielectric sacrificial layer is replaced, through the opening, with a third polysilicon layer between the first and second polysilicon layers. The substrate is removed from a second side opposite to the first side of the substrate, stopping at the stop layer. A source contact opening extending vertically through the stop layer and the dielectric layer is formed to expose part of the first polysilicon layer. A source contact structure in the source contact opening and an interconnect layer connected to the source contact structure are simultaneously formed.

In some embodiments, to simultaneously form the source contact structure and the interconnect layer, a silicide layer is formed in the source contact opening in contact with the exposed part of the first polysilicon layer, the stop layer is removed to expose the dielectric layer, and a metal layer is deposited into the source contact opening and on the dielectric layer.

In some embodiments, to sequentially form the stop layer and the dielectric layer, a first silicon oxide layer, a first silicon nitride layer, and a second silicon oxide layer are sequentially deposited on the substrate.

In some embodiments, to form the dielectric sacrificial layer, a third silicon oxide layer, a second silicon nitride layer, and a fourth silicon oxide layer are sequentially deposited.

In some embodiments, to form the dielectric sacrificial layer, a single silicon oxide layer is deposited.

In some embodiments, to form the opening, the opening extending vertically through the dielectric stack and into the second polysilicon layer is formed, a polysilicon spacer is deposited along a sidewall of the opening, and the opening is extended further through the second polysilicon layer and into or through the dielectric sacrificial layer.

In some embodiments, after replacing the dielectric layer with the third polysilicon layer, the dielectric stack is replaced, through the opening, with a memory stack.

In some embodiments, after replacing the dielectric stack with the memory stack, an insulating structure is formed in the opening.

In some embodiments, to form the channel structure, a channel hole extending vertically through the dielectric stack, the second polysilicon layer, and the dielectric sacrificial layer, and into the first polysilicon layer is formed, and a memory film and a semiconductor channel are sequentially formed along a sidewall of the channel hole.

In some embodiments, to replace the dielectric sacrificial layer with the third polysilicon layer, the dielectric sacrificial layer is removed, through the opening, to form a cavity between the first and second polysilicon layers, part of the memory film is removed, through the opening, to expose part of the semiconductor channel along the sidewall of the channel hole, and polysilicon is deposited, through the opening, into the cavity to form the third polysilicon layer.

In some embodiments, at least one of the first, second, and third polysilicon layers is doped with an N-type dopant. In some embodiments, the N-type dopant is diffused in the first, second, and third polysilicon layers.

According to still another aspect of the present disclosure, a 3D memory device includes a polysilicon layer, a memory stack including interleaved stack conductive layers and stack dielectric layers, a channel structure, and a slit structure. The channel structure extends vertically through the memory stack and into the polysilicon layer and includes a memory film and a semiconductor channel. Part of the semiconductor channel along a sidewall of the channel structure is in contact with a sublayer of the polysilicon layer. The slit structure extends vertically through the memory stack and the sublayer of the polysilicon layer.

In some embodiments, the 3D memory device further includes a dielectric layer in contact with the polysilicon layer, a source contact structure extending vertically through the dielectric layer and in contact with the polysilicon layer, and an interconnect layer connected to the source contact structure.

In some embodiments, the source contact structure and the interconnect layer include a same metal.

In some embodiments, the 3D memory device further includes a dielectric sacrificial layer coplanar with the sublayer of the polysilicon layer and in a peripheral region outside of the memory stack.

In some embodiments, the dielectric sacrificial layer includes a first silicon oxide layer, a silicon nitride layer, and a second silicon oxide layer.

In some embodiments, the dielectric sacrificial layer includes a single silicon oxide layer.

In some embodiments, the dielectric sacrificial layer is sandwiched between part of the polysilicon layer excluding the sublayer and extending laterally into the peripheral region.

In some embodiments, the interconnect layer includes a contact pad in the peripheral region.

In some embodiments, the polysilicon layer includes an N-type doped polysilicon layer.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    sequentially forming a first polysilicon layer, a dielectric sacrificial layer, a second polysilicon layer, and a dielectric stack above a substrate;
    forming a channel structure extending vertically through the dielectric stack, the second polysilicon layer, and the dielectric sacrificial layer, and into the first polysilicon layer;
    forming an opening extending vertically through the dielectric stack and into the second polysilicon layer;
    forming a polysilicon spacer along a sidewall of the opening;
    extending the opening further through the second polysilicon layer and into or through the dielectric sacrificial layer; and
    replacing, through the opening, the dielectric sacrificial layer with a third polysilicon layer between the first and second polysilicon layers.

2. The method of claim 1, wherein the polysilicon spacer abuts the dielectric stack but not the dielectric sacrificial layer.

3. The method of claim 1, further comprising after replacing the dielectric sacrificial layer with the third polysilicon layer, replacing, through the opening, the dielectric stack with a memory stack.

4. The method of claim 3, further comprising after replacing the dielectric stack with the memory stack, forming a slit structure in the opening.

5. The method of claim 1, wherein forming the dielectric sacrificial layer comprises sequentially depositing a first silicon oxide layer, a silicon nitride layer, and a second silicon oxide layer.

6. The method of claim 1, wherein forming the dielectric sacrificial layer comprises depositing a single silicon oxide layer.

7. The method of claim 1, wherein forming the channel structure comprises:
    forming a channel hole extending vertically through the dielectric stack, the second polysilicon layer, and the dielectric sacrificial layer, and into the first polysilicon layer; and
    sequentially forming a memory film and a semiconductor channel along a sidewall of the channel hole.

8. The method of claim 7, wherein replacing the dielectric sacrificial layer with the third polysilicon layer comprises:
    removing, through the opening, the dielectric sacrificial layer to form a cavity between the first and second polysilicon layers;
    removing, through the opening, part of the memory film to expose part of the semiconductor channel along the sidewall of the channel hole; and
    depositing, through the opening, polysilicon into the cavity to form the third polysilicon layer.

9. The method of claim 1, wherein at least one of the first, second, and third polysilicon layers is doped with an N-type dopant, and the method further comprises diffusing the N-type dopant in the first, second, and third polysilicon layers.

10. A method for forming a three-dimensional (3D) memory device, comprising:
sequentially forming a stop layer, a dielectric layer, a first polysilicon layer, a dielectric sacrificial layer, a second polysilicon layer, and a dielectric stack at a first side of a substrate;
forming a channel structure extending vertically through the dielectric stack, the second polysilicon layer, and the dielectric sacrificial layer, and into the first polysilicon layer;
forming an opening extending vertically through the dielectric stack and the second polysilicon layer, and extending vertically into or through the dielectric sacrificial layer to expose part of the dielectric sacrificial layer;
replacing, through the opening, the dielectric sacrificial layer with a third polysilicon layer between the first and second polysilicon layers;
removing, from a second side opposite to the first side of the substrate, the substrate, stopping at the stop layer;
forming a source contact opening extending vertically through the stop layer and the dielectric layer to expose part of the first polysilicon layer; and
simultaneously forming a source contact structure in the source contact opening and an interconnect layer connected to the source contact structure.

11. The method of claim 10, wherein simultaneously forming the source contact structure and the interconnect layer comprises:
forming a silicide layer in the source contact opening in contact with the exposed part of the first polysilicon layer; and
removing the stop layer to expose the dielectric layer; and
depositing a metal layer into the source contact opening and on the dielectric layer.

12. The method of claim 10, wherein sequentially forming the stop layer and the dielectric layer comprises sequentially depositing a first silicon oxide layer, a first silicon nitride layer, and a second silicon oxide layer on the substrate.

13. The method of claim 10, wherein forming the dielectric sacrificial layer comprises sequentially depositing a third silicon oxide layer, a second silicon nitride layer, and a fourth silicon oxide layer.

14. The method of claim 10, wherein forming the dielectric sacrificial layer comprises depositing a single silicon oxide layer.

15. The method of claim 10, wherein forming the opening comprises:
forming the opening extending vertically through the dielectric stack and into the second polysilicon layer;
forming a polysilicon spacer along a sidewall of the opening; and
extending the opening further through the second polysilicon layer and into or through the dielectric sacrificial layer.

16. The method of claim 10, further comprising after replacing the dielectric layer with the third polysilicon layer, replacing, through the opening, the dielectric stack with a memory stack.

17. The method of claim 16, further comprising after replacing the dielectric stack with the memory stack, forming an insulating structure in the opening.

18. The method of claim 10, wherein forming the channel structure comprises:
forming a channel hole extending vertically through the dielectric stack, the second polysilicon layer and the dielectric sacrificial layer, and into the first polysilicon layer; and
sequentially forming a memory film and a semiconductor channel along a sidewall of the channel hole.

19. The method of claim 18, wherein replacing the dielectric sacrificial layer with the third polysilicon layer comprises:
removing, through the opening, the dielectric sacrificial layer to form a cavity between the first and second polysilicon layers;
removing, through the opening, part of the memory film to expose part of the semiconductor channel along the sidewall of the channel hole; and
depositing, through the opening, polysilicon into the cavity to form the third polysilicon layer.

20. A method for forming a three-dimensional (3D) memory device, comprising:
sequentially forming a first polysilicon layer, a dielectric sacrificial layer, a second polysilicon layer, and a dielectric stack above a substrate, wherein forming the dielectric sacrificial layer comprises sequentially depositing a first silicon oxide layer, a silicon nitride layer, and a second silicon oxide layer;
forming a channel structure extending vertically through the dielectric stack, the second polysilicon layer, and the dielectric sacrificial layer, and into the first polysilicon layer;
forming (i) an opening extending vertically through the dielectric stack and the second polysilicon layer, and extending vertically into or through the dielectric sacrificial layer to expose part of the dielectric sacrificial layer, and (ii) a polysilicon spacer along part of a sidewall of the opening; and
replacing, through the opening, the dielectric sacrificial layer with a third polysilicon layer between the first and second polysilicon layers.

* * * * *